United States Patent [19]
Kawano

[11] Patent Number: 5,461,339
[45] Date of Patent: Oct. 24, 1995

[54] APPARATUS FOR PROCESSING FREQUENCY MODULATED SIGNALS

[75] Inventor: Tsutomu Kawano, Itami, Japan

[73] Assignee: Mitsubishi Denki Kabushiki Kaisha, Tokyo, Japan

[21] Appl. No.: 45,474

[22] Filed: Apr. 13, 1993

[30] Foreign Application Priority Data

Apr. 23, 1992 [JP] Japan .................................. 4-104246

[51] Int. Cl.$^6$ .............................. H03D 3/00; H04N 5/94
[52] U.S. Cl. ........................ 329/320; 327/113; 327/262; 360/30
[58] Field of Search .............................. 329/320; 360/30; 327/113, 114, 551, 262, 361

[56] References Cited

U.S. PATENT DOCUMENTS

| 3,546,608 | 12/1970 | Carassa et al. | 329/320 |
|---|---|---|---|
| 4,470,080 | 9/1984 | Kimura | 360/30 |
| 4,908,581 | 3/1990 | Honjo | 329/320 |

FOREIGN PATENT DOCUMENTS

| 3915454 | 12/1989 | Germany. | |
|---|---|---|---|
| 56-27927 | 6/1981 | Japan. | |
| 61-38 | 1/1986 | Japan. | |
| 2-15464 | 1/1990 | Japan | 360/30 |

OTHER PUBLICATIONS

B. Morgenstern, 1985, "Technik Der Magnetischen Videosignalaufzeichnung", pp. 90–95 (month unknown).
Claus Biaesch–Wiebke, Videosysteme, 1991, pp. 159–161 (month unknown).

Primary Examiner—Andrew M. Dolinar
Attorney, Agent, or Firm—Oblon, Spivak, McClelland, Maier & Neustadt

[57] ABSTRACT

A simplified apparatus for processing frequency modulated signals is disclosed which is equipped with a frequency characteristic correction function and an inversion prevention function. An input signal is processed with different parameters within a cosine equalizer so that the cosine equalizer outputs two different signals, i.e., one frequency characteristic of which was corrected and the other which was processed with no consideration on frequency characteristic but aiming at restoring lost zero cross points. From the two signals, compensation signal generating means generates a compensation signal which is necessary to restore the lost zero cross points. The frequency characteristic-corrected signal from the cosine equalizer is delayed in a delay line for a period of time required to generate the compensation signal. Thus delayed signal from the delay line and the compensation signal are given to an adder where they are superimposed to generate a frequency characteristic-corrected signal in which disappearance of the zero cross point is not found.

24 Claims, 19 Drawing Sheets

INVERSION

BL ← → WH

BL    WH

BL    WH

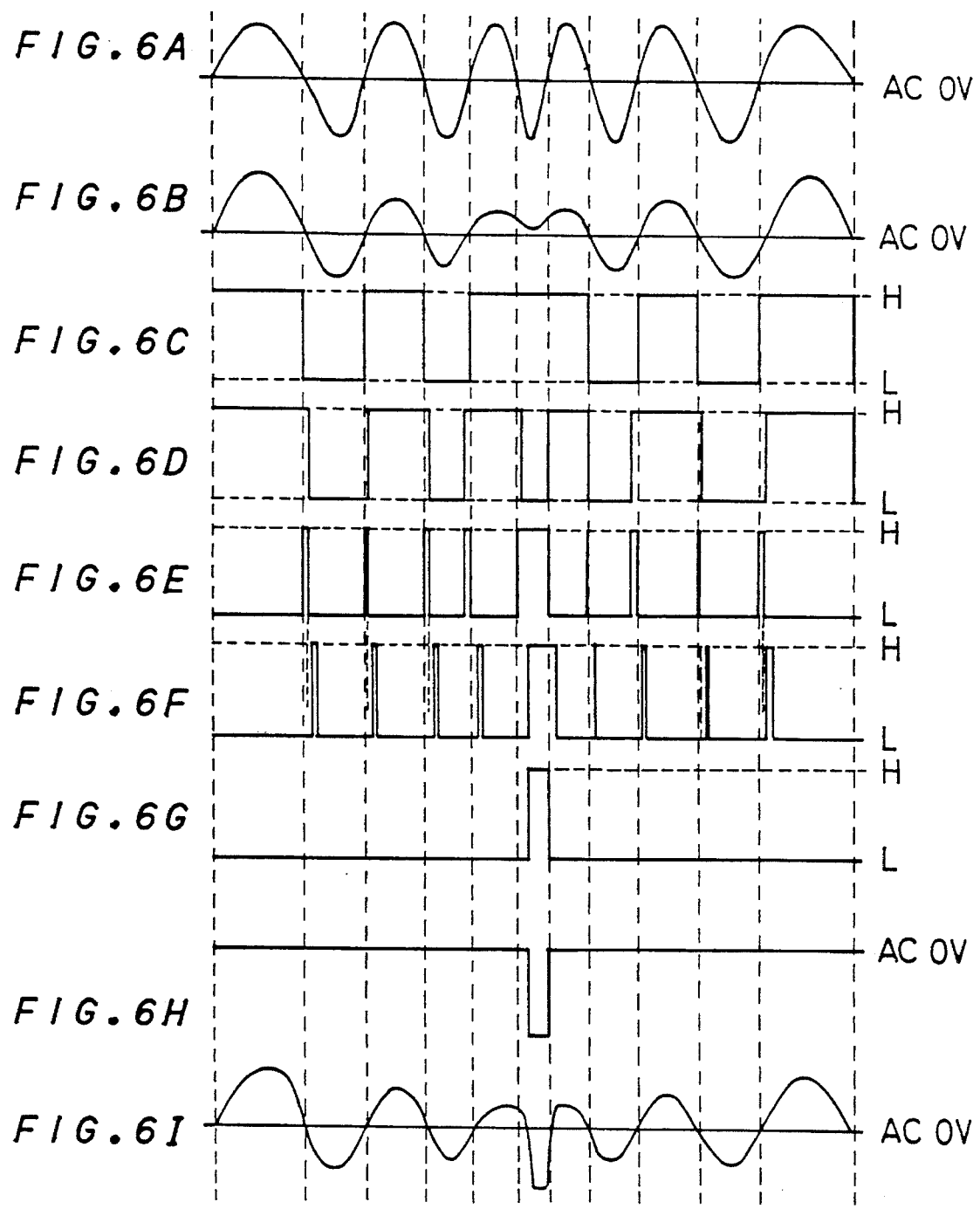

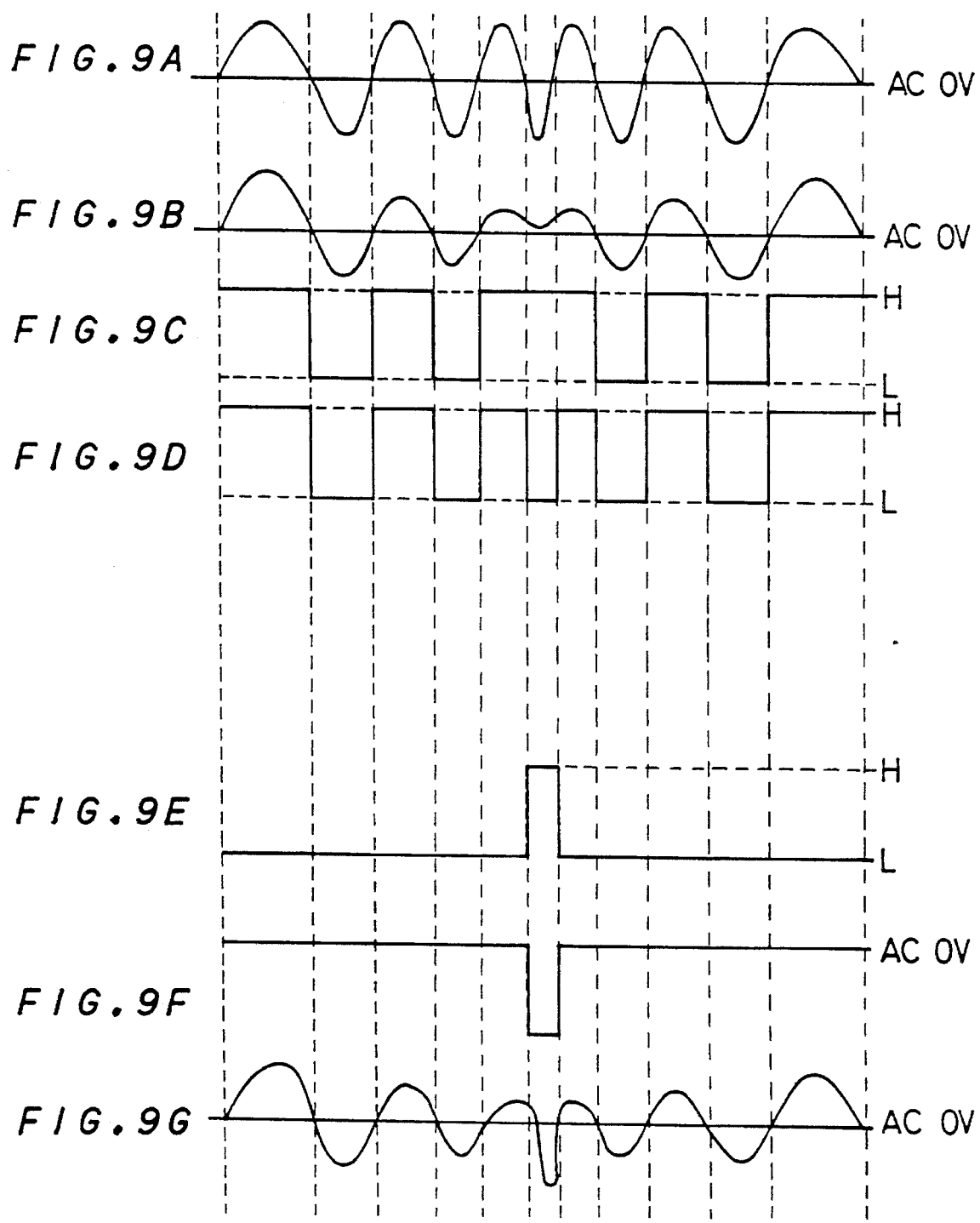

APPARATUS FOR PROCESSING FREQUENCY MODULATED SIGNALS

BACKGROUND OF THE INVENTION

1. Field of the Invention

The present invention relates to a frequency modulated signal processing apparatus for use in frequency demodulation for frequency modulating, recording and reproducing an image signal and so on. The present invention particularly relates to such an apparatus which easily and efficiently compensates for deterioration of a frequency modulated signal due to a frequency characteristic of electromagnetic conversion.

2. Description of the Prior Art

An image signal recording/reproducing apparatus records on a magnetic tape a frequency modulated wave which is frequency modulated with an image signal and reproduces the recorded frequency modulated wave. Such an apparatus is encountered with what is generally referred to as "inversion" (described later) during recording of a frequency modulated wave with a high modulation index.

FIG. 1 is a circuitry block diagram of a reproduction system of an image signal recording/reproducing apparatus. In the reproduction system, a frequency modulated signal is reproduced from a magnetic tape 120 by video head 121. The reproduced weak frequency modulated signal is subjected in sequence to amplification at an amplifier 122, correction of its frequency characteristic at an RF equalizer circuit 123, amplitude limiting at a limiting circuit 124, and frequency demodulation at a frequency demodulator 125, before finally reproduced into an image signal by a de-emphasis circuit 126. The image signal recording/reproducing apparatus is haunted by a problem called inversion. Assume that a picture screen has a white region WH and a black region BL as shown in FIG. 2D, for example. The screen is represented by an image signal having a waveform as that shown in FIG. 2B, however, that has undergone frequency demodulation has a waveform shifting from a black level BL to a white level WII as that shown in FIG. 2A, causing that the white region WH partially turns into black as shown in FIG. 2C. The reason is as follows. The image signal recording/reproducing apparatus, due to electromagnetic conversion characteristics, emphasizes a lower sideband of a frequency modulated wave compared with an upper sideband. Zero cross points are eliminated if this happens, depriving the limiting circuit 124 of FIG. 1 of its capability of outputting a normal frequency modulated wave. Frequency demodulation of the abnormal output from the limiting circuit 124 in turn gives rise to an abnormal image signal which has an abrupt level drop as shown in FIG. 2A. In short, the disappearance of the zero cross points invites inversion.

An answer to this problem is to use the circuit of FIG. 3 as the RF equalizer 123 and the circuit of FIG. 4 as the LIM part 124.

FIGS. 3 and 4 respectively show a conventional cosine equalizer and a conventional LIM part. In FIG. 3, indicated at numerical references 1 and 2 are delay lines, indicated at 127 is a first adder, and indicated at 128 is an amplitude adjustor. A phase invertor is indicated at 129 and a second adder is indicated at 130. These are the elements forming the cosine equalizer. More particularly, one end of the delay line 1 is connected to an input terminal and the other end of the delay line 1 is connected to one end of the delay line 2. Two input terminals of the adder 127 are connected to the other end of the delay line 2 and the one end of the delay line 1. An output terminal of the adder 127 is connected to an input terminal of the amplitude adjustor 128 which has its output terminal connected to an input terminal of the phase invertor 129. Two input terminals of the adder 130 are connected to the other terminal of the delay line 1 and an output terminal of the phase invertor 129. An output signal from the adder 130 is an output signal of the cosine equalizer.

In FIG. 4, a delay line is indicated at 131 and a high pass filter (hereinafter "HPF") or a band pass filter (hereinafter "BPF") which represses lower sideband components is indicated at 132. Indicated at 8 and 9 are sign-judging circuits an output from which is H level in response to an input signal exceeding AC 0 volt but L level in response to an input signal smaller than AC 0 volt. An exclusive OR circuit is indicated at 10, a delay line is indicated at 12, an AND circuit is indicated at 13, a sign control circuit is indicated at 14, another delay line for matching propagation delays of signals is indicated at 11, and an adder is indicated at 15. The LIM part is comprised of these elements. More precisely, an output of the cosine equalizer is coupled to one ends of the delay lines 11 and 131 and an input terminal of the HPF 132. The other end of the delay line 131 is connected to an input terminal of the sign-judging circuit 9. An output terminal of the HPF 132 is connected to an input terminal of the sign-judging circuit 8. An output terminal of the sign-judging circuit 8 is connected to one input terminal of the exclusive OR circuit 10. An output terminal of the sign-judging circuit 9 is connected to the other input terminal of the exclusive OR circuit 10 and a reference signal input terminal of the sign-controlling circuit 14. An output terminal of the exclusive OR circuit 10 is connected to one end of the delay line 12 and one input terminal of the AND circuit 13. The other end of other delay line 12 is connected to the another input terminal of the AND circuit 13. An output terminal of the AND circuit 13 is connected to an input terminal of the sign control circuit 14. Two input terminals of the adder 15 are respectively connected to the other end of the delay line 11 and an output terminal of the sign control circuit 14.

Next, operations will be described, first, about the cosine equalizer, and second, about the LIM part. An input signal $S_{IN}$ given to the input terminal is expressed as:

$$S_{IN}=E \cdot e^{j\psi t} \tag{1}$$

Assuming that the delay line 1 implements a time delay of $\tau$, signals $S_A$, $S_B$ and $S_C$ at junctions A, B and C, respectively, are given as:

$$S_A=E \cdot e^{j\psi t}$$
$$S_B=E \cdot e^{j\psi(t-\tau)} \tag{2}$$
$$S_C=E \cdot e^{j\psi(t-2\tau)}$$

From Eq. 2, a signal $S_D$ at a junction D is:

$$S_D=wE \cdot e^{j\psi(t-\tau)} \cdot \cos\psi\tau \tag{3}$$

The signal $S_D$ is amplified by k times at the amplitude adjustor 128 and thereafter reversed at the phase invertor 129. Hence, a signal $S_E$ at a junction E is given as:

$$S_E=-2 \cdot k \cdot E \cdot e^{j\psi(t-\tau)} \cdot \cos\psi\tau \tag{4}$$

An output signal $S_{OUT}$ available at the output terminal of the adder 15 is given as:

$$S_{OUT}=S_B+S_D=E(1-2\cdot k\cdot\cos\psi\tau)E^{\psi(t-\tau)} \quad (5)$$

Eq. 5 states that the output signal $S_{OUT}$ has a time delay of $\tau$ compared with the input signal $S_{IN}$ but shows no phase distortion at all from the input signal $S_{IN}$. The amplitude frequency characteristic as shown in Eq. 5 is depicted in FIG. 5A. According to the characteristic of the cosine equalizer as represented in Eq. 5 and FIG. 5A, the amplitude is maximum when $\psi\tau=\bar{a}\pi$ where $a$ is a positive odd value, i.e., when the frequency is $f=1/(2\bar{a}\tau)$ (where $\psi=2\pi f$).

The cosine equalizer is used in, for instance, magnetic recording in which a lower sideband is reproduced with a larger amplitude than an upper sideband as shown in FIG. 5B. If the signal processing by the cosine equalizer as set to have an adjusted k is implemented on a signal which is asymmetrical with respect to the frequency of a carrier signal, a resultant signal has a corrected symmetrical spectrum with respect to the frequency of the carrier signal and shows no phase distortion.

Next, the LIM part will be described with the waveform diagrams of FIGS. 6A to 6I. FIG. 4 is a circuit receiving a signal of FIG. 6A. The delay line 131 implements as long time delay as a time delay implemented by the HPF 132. If an output from the delay line 131 is at a higher level than the center of its amplitude (AC 0 Volt), an output from the sign-judging circuit 9 has an H level, for example, and if an output from the delay line 131 is at a lower level than the center of the amplitude, an output from the sign-judging circuit 9 has an L level. A signal thus developed has a waveform as that shown in FIG. 6C. On the other hand, the HPF 132 develops a waveform in which zero cross points, if somewhat dislocated from the original zero cross points, are preserved. This signal is fed from the HPF 132 to the sign-judging circuit 8 from which it is outputted as a signal having a waveform of FIG. 6D. The signals of FIGS. 6C and 6D are passed to the exclusive OR circuit 10 and processed therein by computation, yielding a signal as shown in FIG. 6E, i.e., a frequency modulated wave which surges to the H level only at the disappearance or the deviation of the zero cross points. By extracting a pulse which remains at the H level for a relatively long period of time, precisely, more than a time t, and thereafter processing the consequent signal in light of the polarity of the original frequency modulated wave, the zero cross points of the original frequency modulated wave are restored. The time t is given as follows.

$$t = \frac{1}{\text{(maximum instant frequency of a frequency modulated wave)} \times 2} \quad (6)$$

Hence, by delaying the waveform of FIG. 6E and thereby generating a waveform of FIG. 6F, and thereafter processing the signals of FIGS. 6E and 6F in the AND circuit 13 in such a manner that a pulse which corresponds to the disappearance of the zero cross points is extracted, a signal of FIG. 6G is obtained. Superimposition of the extracted pulse requires consideration on the polarity. That is, in order to restore the zero cross points in the output signal of FIG. 6C from the cosine equalizer, the pulse as it is reversed to go negative is superimposed on the input frequency modulated wave since the disappearance of the zero cross points is observed while the signal of FIG. 6C stays at the H level. On the contrary, if the disappearance of the zero cross points is observed while the signal of FIG. 6C stays at the L level, the extracted positive going pulse as it is superimposed on the input frequency modulated wave. This process is accomplished in the sign control circuit 14. Hence, the sign control circuit 14 converts the signal of FIG. 6G into a signal as that shown in FIG. 6H which will be superimposed on the frequency modulated wave from the cosine equalizer in the adder 15, whereby a signal as that shown in FIG. 6I is generated. As shown in FIG. 6I, the zero cross points are restored in the resulting waveform. Moreover, since superimposition of the upper sideband components having a poor C-N ratio is executed only where the zero cross points were erased, demodulation with an excellent S-N ratio is attained without causing post-demodulation changes in frequency characteristic. In short, change in inversion suppression effect would not lead to variation or distortion in frequency characteristic of a demodulated image signal.

Thus, in the conventional apparatus for processing frequency modulated signals, the RF equalizer 123 performs waveform correction without causing phase distortion, and the LIM part 124 restores only disappeared zero cross points, which advantageously attains no deterioration in an S-N ratio, correction of frequency characteristic and suppression of the inversion. However, its design complexity due to a number of components required therein cannot be blind-eyed.

SUMMARY OF THE INVENTION

According to a first aspect of the invention, an apparatus for processing frequency modulated signals comprises: a cosine equalizer including an input terminal for receiving an input signal, a first output terminal and a second output terminal, the cosine equalizer processing the input signal with a first and a second parameters which are different from each other to thereby generate a first and a second signals, the first and the second signals being outputted at the first and the second output terminals, respectively; compensation signal generating means connected to the first and the second output terminals of the cosine equalizer, the compensation signal generating means processing the first and the second signals, detecting zero cross points which are disappeared from the first signal, and generating a compensation signal which is used in compensating for the zero cross points; signal delaying means having an input terminal which is connected to the first output terminal of the cosine equalizer, the signal delaying means delaying the first signal for a time required for generating the compensation signal; and signal synthesizing means having one input terminal and the other input terminal, the one input terminal being connected to an output terminal of the compensation signal generating means, the other input terminal being connected to an output terminal of the signal delaying means, the signal synthesizing means superimposing the output signal from the compensation signal generating means on an output signal from the signal delaying means.

Preferably, the signal synthesizing means includes an adder.

Thus, the cosine equalizer of the apparatus of the first aspect includes the input terminal and the first and the second output terminals, and processes the input signal with the different parameters, i.e., the first and the second parameters and output the first and the second signals respectively at the first and the second output terminals. The parameter for processing the first signal is set so as to the frequency characteristic of the first signal is corrected. The parameter for processing the second signal is set in order not to erase the zero cross points. Processes the first and the second output signals, the compensation signal generating means detects only cross points which disappeared from the first signal and generates the compensation signal which is necessary to compensate for the disappearance of the zero cross points. A pulse of the compensation signal thus derived well reflects the disappeared zero cross points. On the other hand, the signal delaying means delays the first signal for the time required for generating the compensation signal. The output signal from the compensation signal generating means and the output signal from the signal delaying means are given to the signal synthesizing means where they are superimposed.

Hence, it is possible in the first aspect of the invention to obtain a simplified apparatus which process a frequency modulated signal while preventing the inversion without deteriorating an S-N ratio and which corrects the frequency characteristic of the frequency modulated signal without deteriorating the phase characteristic of the frequency modulated signal. The apparatus of the first aspect can manufactured at reduced costs.

According to a second aspect of the invention, the cosine equalizer includes: first delaying means having an input terminal connected to the input terminal of the cosine equalizer; second delaying means having an input terminal connected to an output terminal of the first delaying means; an adder connected to the input terminal of the cosine equalizer and an output terminal of the second delaying means, the adder superimposing the input signal on an output signal from the second delaying means; a first amplitude adjustor having an input terminal connected to an output terminal of the adder, the first amplitude adjustor amplifying an output signal from the adder by a first constant; a second amplitude adjustor having an input terminal connected to the output terminal of the adder, the first amplitude adjustor amplifying the output signal from the adder by a second constant; a first subtracter, one input terminal of the first subtracter being connected to the output terminal of the first delaying means, the other input terminal of the first subtracter being connected to an output terminal of the first amplitude adjustor, the first subtracter subtracting an output signal of the first amplitude adjustor from an output signal of the first delaying means; and a second subtracter, one input terminal of the second subtracter being connected to the output terminal of the first delaying means, the other input terminal of the second subtracter being connected to the output terminal of an second amplitude adjustor, the second subtracter subtracting an output signal of the second amplitude adjustor from the output signal of the first delaying means.

The compensation signal generating means preferably includes: a first sign-judging means having an input terminal connected to the first output terminal of the cosine equalizer, the first sign-judging means receiving the first signal at the input terminal thereof, judging whether the first signal is positive or negative, and outputting a signal indicative of a judgment; a second sign-judging means having an input terminal connected to the second output terminal of the cosine equalizer, the second sign-judging means receiving the second signal at the input terminal thereof, judging whether the second signal is positive or negative, and outputting an output signal indicative of the judgment; signal comparing means, one input terminal of the one input terminal of the signal comparing means being connected to an output terminal of the first sign-judging means, the other input terminal of the signal comparing means being connected to an output terminal of the second sign-judging means, the signal comparing means comparing the output from the first sign-judging means with the output from the second sign-judging means, detecting a different portion between the output signals of the first and the second sign-judging means, and outputting an output signal indicative of the comparison; and sign control means, one input terminal of the one input terminal of the sign control means being connected to the output terminal of the first sign-judging means, the other input terminal of the sign control means being connected to an output terminal of the signal comparing means, the sign control means outputting a negative going signal in accordance with the output signal from the signal comparing means if the different portion in the output signal of the first sign-judging means has is positive, the sign control means outputting a positive going signal in accordance with the output signal from the signal comparing means if the different portion in the output signal of the first sign-judging means has is negative.

Further, an output terminal of the signal comparing means may be directly connected to the other input terminal of the sign control means.

Further, the signal comparing means may include an exclusive OR circuit, input terminals of the exclusive OR circuit being respectively connected to the output terminals of the first and the second sign-judging means.

Further, the compensation signal generating means preferably further includes: another signal delaying means having an input terminal connected to the output terminal of the signal comparing means; and an AND gate, one input terminal of the AND gate being connected to the output terminal of the signal comparing means, the other input terminal of the AND gate being connected to an output terminal of the another signal comparing means, an output terminal of the AND gate being connected to the input terminal of the sign control means.

Alternatively, the compensation signal generating means may include: a first sign-judging means having an input terminal connected to the first output terminal of the cosine equalizer, the first sign-judging means receiving the first signal at the input terminal thereof, judging whether the first signal is positive or negative, and outputting a signal indicative of a judgment; a second sign-judging means having an input terminal connected to the second output terminal of the cosine equalizer, the second sign-judging means receiving the second signal at the input terminal thereof, judging whether the second signal is positive or negative, and outputting an output signal indicative of the judgment; signal comparing means, one input terminal of the one input terminal of the signal comparing means being connected to an output terminal of the first sign-judging means, the other input terminal of the signal comparing means being connected to an output terminal of the second sign-judging means, the signal comparing means comparing the output from the first sign-judging means with the output from the second sign-judging means, detecting a different portion between the output signals of the first and the second sign-judging means, and outputting an output signal indicative of the comparison; and sign control means, one input terminal of the one input terminal of the sign control means being connected to the output terminal of the second sign-judging means, the other input terminal of the sign control means being connected to an output terminal of the signal comparing means, the sign control means outputting a negative going signal in accordance with the output signal from the signal comparing means if the different portion in the output signal of the second sign-judging means has is positive, the sign control means outputting a positive going signal in accordance with the output signal from the signal comparing means if the different portion in the output signal of the second sign-judging means has is negative.

Further, the signal comparing means may include an exclusive OR circuit, input terminals of the exclusive OR circuit being respectively connected to the output terminals of the first and the second sign-judging means.

The signal generating means may further include: another signal delaying means having an input terminal connected to the output terminal of the signal comparing means; and an AND gate, one input terminal of the AND gate being connected to the output terminal of the signal comparing means, the other input terminal of the AND gate being connected to an output terminal of the another signal comparing means, an output terminal of the AND gate being connected to the input terminal of the sign control means.

The second constant is preferably greater than the first constant.

The first and the second delaying means preferably include a delay line.

Thus, in the apparatus of the second aspect, the first delaying means implements a fixed time delay into the input signal. The second further delaying means delays the output signal from the first delaying means by as long time as the delay time the first delaying means implements. The adder superimposes the input signal and the output signal from the second delaying means. The first and the second amplitude adjustors amplify the output signal from the adder respectively by the first and the second constants. The first subtracter subtracts the output signal of the first amplitude adjustor from the output signal of the first delaying means while the second subtracter subtracts the output signal of the second amplitude adjustor from the output signal of the second delaying means. Since the first and the second amplitude adjustors use the different parameters, the first and the second subtracters generate different outputs, which allows the cosine equalizer to output the first signal the frequency characteristic of which was corrected and the second signal in which zero cross points are preserved.

Hence, it is possible in the second aspect of the invention to obtain a simplified apparatus which process a frequency modulated signal while preventing the inversion without deteriorating an S-N ratio and which corrects the frequency characteristic of the frequency modulated signal without deteriorating the phase characteristic of the frequency modulated signal. The apparatus of the first aspect can manufactured at reduced costs.

According to a third aspect of the invention, the cosine equalizer includes: impedance adjusting means having one terminal connected to the input terminal of the cosine equalizer; a total reflection type delaying means having one terminal connected to the the other terminal of the impedance adjusting means; a first buffer having an input terminal connected to the other terminal of the impedance adjusting means, the first buffer having a high input impedance; a second buffer having an input terminal connected to the other input terminal of the total reflection type delaying means, the second buffer having a high input impedance; a first amplitude adjustor having an input terminal connected to an output terminal of the first buffer, the first amplitude adjustor amplifying an output signal from the first buffer by a first constant; a second amplitude adjustor having an input terminal connected to the output terminal of the first buffer, the second amplitude adjustor amplifying the output signal from the first buffer by a second constant; a first subtracter, one input terminal of the first subtracter being connected to an output terminal of the second buffer, the other input terminal of the first subtracter being connected to an output terminal of the first amplitude adjustor, the first subtracter subtracting an output signal of the first amplitude adjustor from an output signal of the second buffer; and a second subtracter, one input terminal of the second subtracter being connected to the output terminal of the second buffer, the other input terminal of the second subtracter being connected to the output terminal of an second amplitude adjustor, the second subtracter subtracting an output signal of the second amplitude adjustor from the output signal of the second buffer.

The impedance adjusting means is preferably comprised of resistors.

The compensation signal generating means preferably includes: a first sign-judging means having an input terminal connected to the first output terminal of the cosine equalizer, the first sign-judging means receiving the first signal at the input terminal thereof, judging whether the first signal is positive or negative, and outputting a signal indicative of a judgment; a second sign-judging means having an input terminal connected to the second output terminal of the cosine equalizer, the second sign-judging means receiving the second signal at the input terminal thereof, judging whether the second signal is positive or negative, and outputting an output signal indicative of the judgment; signal comparing means, one input terminal of the one input terminal of the signal comparing means being connected to an output terminal of the first sign-judging means, the other input terminal of the signal comparing means being connected to an output terminal of the second sign-judging means, the signal comparing means comparing the output from the first sign-judging means with the output from the second sign-judging means, detecting a different portion between the output signals of the first and the second sign-judging means, and outputting an output signal indicative of the comparison; and sign control means, one input terminal of the one input terminal of the sign control means being connected to the output terminal of the first sign-judging means, the other input terminal of the sign control means being connected to an output terminal of the signal comparing means, the sign control means outputting a negative going signal in accordance with the output signal from the signal comparing means if the different portion in the output signal of the first sign-judging means has is positive, the sign control means outputting a positive going signal in accordance with the output signal from the signal comparing means if the different portion in the output signal of the first sign-judging means has is negative.

An output terminal of the signal comparing means may be directly connected to the other input terminal of the sign control means.

The signal comparing means preferably includes an exclusive OR circuit, input terminals of the exclusive OR circuit being respectively connected to the output terminals of the first and the second sign-judging means.

The compensation signal generating means may further include: another signal means having an input terminal connected to the output terminal of the signal comparing means; and an AND gate, one input terminal of the AND gate being connected to the output terminal of the signal comparing means, the other input terminal of the AND gate being connected to an output terminal of the another signal comparing means, an output terminal of the AND gate being connected to the input terminal of the sign control means.

Alternatively, the compensation signal generating means includes: a first sign-judging means having an input terminal connected to the first output terminal of the cosine equalizer, the first sign-judging means receiving the first signal at the input terminal thereof, judging whether the first signal is positive or negative, and outputting a signal indicative of a judgment; a second sign-judging means having an input terminal connected to the second output terminal of the cosine equalizer, the second sign-judging means receiving the second signal at the input terminal thereof, judging whether the second signal is positive or negative, and outputting an output signal indicative of the judgment; signal comparing means, one input terminal of the one input terminal of the signal comparing means being connected to an output terminal of the first sign-judging means, the other input terminal of the signal comparing means being connected to an output terminal of the second sign-judging means, the signal comparing means comparing the output from the first sign-judging means with the output from the second sign-judging means, detecting a different portion between the output signals of the first and the second sign-judging means, and outputting an output signal indicative of the comparison; and sign control means, one input terminal of the one input terminal of the sign control means being connected to the output terminal of the second sign-judging means, the other input terminal of the sign control means being connected to an output terminal of the signal comparing means, the sign control means outputting a positive going signal in accordance with the output signal from the signal comparing means if the different portion in the output signal of the second sign-judging means has is positive, the sign control means outputting a negative going signal in accordance with the output signal from the signal comparing means if the different portion in the output signal of the second sign-judging means has is negative.

Further, the signal comparing means may include an exclusive OR circuit, input terminals of the exclusive OR circuit being respectively connected to the output terminals of the first and the second sign-judging means.

The compensation signal generating means preferably further includes: another signal delaying means having an input terminal connected to the output terminal of the signal comparing means; and an AND gate, one input terminal of the AND gate being connected to the output terminal of the signal comparing means, the other input terminal of the AND gate being connected to an output terminal of the another signal comparing means, an output terminal of the AND gate being connected to the input terminal of the sign control means.

In the third aspect, the second constant may be greater than the first constant.

The total reflection type delaying means may include a total reflection type delay line.

The another delaying means preferably include a delay line.

Thus, the cosine equalizer of the apparatus of the first aspect includes the input terminal and the first and the second output terminals, and processes the input signal with the different parameters, i.e., the first and the second parameters and output the first and the second signals respectively at the first and the second output terminals. The parameter for processing the first signal is set so as to the frequency characteristic of the first signal is corrected. The parameter for processing the second signal is set in order not to erase the zero cross points. Processes the first and the second output signals, the compensation signal generating means detects only cross points which disappeared from the first signal and generates the compensation signal which is necessary to compensate for the disappearance of the zero cross points. A pulse of the compensation signal thus derived well reflects the disappeared zero cross points. On the other hand, the signal delaying means delays the first signal for the time required for generating the compensation signal. The output signal from the compensation signal generating means and the output signal from the signal delaying means are given to the signal synthesizing means where they are superimposed.

Hence, it is possible in the first aspect of the invention to obtain a simplified apparatus which process a frequency modulated signal while preventing the inversion without deteriorating an S-N ratio and which corrects the frequency characteristic of the frequency modulated signal without deteriorating the phase characteristic of the frequency modulated signal. The apparatus of the first aspect can manufactured at reduced costs.

Thus, the cosine equalizer of the apparatus of the third aspect comprises the impedance adjusting means having its one terminal connected to the input termiual of the cosine equalizer, the total reflection type delaying means having its one terminal connected to the other terminal of the impedance adjusting means, the first high input impcdancc buffer having its input terminal connected to the other terminal of the impcdancc adjusting means, and the second high input impedance buffer having its input terminal connected to said other input terminal of said total reflection type delaying means. The total reflection type delaying means implements a fixed time delay into the input signal received at its one terminal and outputs the delayed signal at its other terminal. While at the same time, the signal reflected at the other terminal of the total reflection type delaying means is delayed for a time twice longer the fixed time delay and outputted at the one terminal of the total reflection type delaying means. The first and the second amplitude adjustors amplify the signal received through the first buffer and the signal reflected at the other terminal of the total reflection type delaying means, respectively, with the first and the second constants. The first and the second subtracters subtract the output signals of the first and the second amplitude adjustors from the signal which is received through the second buffer from the other terminal of the total reflection type delaying means. Since the first and the second amplitude adjustors use the different parameters, the first and the second subtracters generate different outputs, which allows the cosine equalizer to output the first signal the frequency characteristic of which was corrected and the second signal in which zero cross points are preserved.

Hence, compared with the cosine equalizer of the second aspect of the invention, the cosine equalizer of the third aspect has a decreased number of the delaying means, further reducing the design complexity. The inversion prevention structure is also less complex than that of the second aspect, and of course, is not accompanied by deterioration in the S-N ratio. It is also the same as in the apparatuses of the foregoing aspects that the frequency characteristic of a frequency modulated signal without deteriorating the phase characteristic of the frequency modulated signal, and that the apparatus of the third aspect can manufactured at reduced costs.

Accordingly, it is an object of the present invention to simplify the structures of a frequency modulated signal processing apparatus which corrects the frequency characteristic of a frequency modulated signal without deteriorating the S-N ratio while preventing the inversion, thereby reducing the number of components to be used in the apparatus.

BRIEF DESCRIPTION OF THE DRAWINGS

FIGS. 6A to 6I are waveform diagrams depicting output signals from respective components forming the conventional inversion prevention apparatus of FIG. 4;

FIGS. 9A to 9G are waveform diagrams depicting output signals from respective components forming the conventional inversion prevention apparatus of FIG. 7;

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
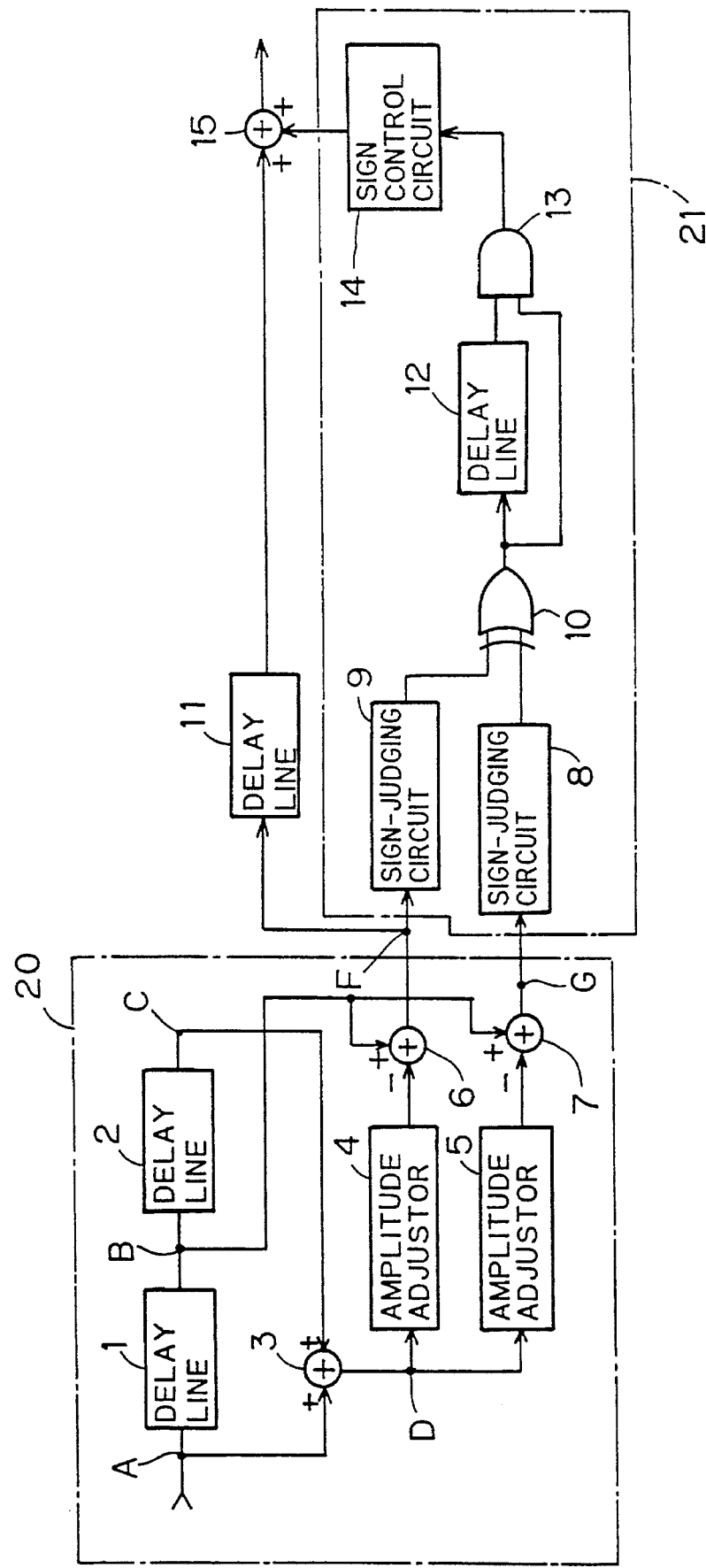
FIG. 7 is a block diagram showing structures of an apparatus for processing frequency modulated signals according to a first preferred embodiment of the present invention.

A first preferred embodiment of the present invention will be described in the following with FIGS. 7, 8A to 8D and 9A to 9G. FIG. 7 is a block diagram of an apparatus for processing frequency modulated signals according to the first preferred embodiment of the present invention. In FIG. 7, delay lines are indicated at numerical references 1 and 2 each delay propagation of an input signal received therein by a fixed amount of time τ, an adder is indicated at 3 which superimposes the levels of two signals it received and outputs a resultant signal, and amplitude adjustors are indicated at 4 and 5. The amplitude adjustor 4 amplifies the level of an input signal by a constant k1 and outputs the signal now having a renewed level while the amplitude adjustor 5 amplifies the level of an input signal by a constant k2 and outputs the signal now having a renewed level. Indicated at 6 and 7 are subtracters each find a difference between two input signal levels received therein and output the difference as a signal, and indicated at 8 and 9 are sign-judging circuits each judging the sign of a signal received therein and outputting a signal representing the judgment. An exclusive OR circuit is indicated at 10, delay lines are indicated at 11 and 12, an AND circuit is indicated at 13, and a sign control circuit is indicated at 14 which changes the sign of an input signal in light of the polarity of a reference signal. An adder is indicated at 15 which superimposes the levels of two input signals it received and outputs a consequent signal, a cosine equalizer is indicated at 20, and compensation signal generating means is indicated at 21. First, the cosine equalizer 20 is described as to its structure. An input terminal is connected to one end of the delay line 1 which has another end connected to one end of the delay line 2. Two input terminals of the adder 3 are connected to the one end of the delay line 1 and the other end of the delay line 2. An output terminal of the adder 3 is connected to input terminals of the amplitude adjustors 4 and 5 which have their output terminals respectively connected to one input terminals of the subtracter 6 and 7. The other input terminals of the subtracters 6 and 7 are connected to the other end of the delay line 1. Outputs from the subtracters 6 and 7 are what the cosine equalizer 20 eventually outputs. Next, the compensation signal generating means 21 is described as to its structure. Output terminals of the subtracters 6 and 7 are connected to input terminals of the sign-judging circuits 8 and 9, or first and second sign-judging means. The exclusive OR circuit 10, the AND circuit 13 and the delay line 12 form signal comparing means in which one input terminal of the exclusive OR circuit 10 is connected to an output terminal of the sign-judging circuit 8. The other input terminal of the exclusive OR circuit 10 is connected to an output terminal of the sign-judging circuit 9. The output terminal of the sign-judging circuit 9 is also connected to a reference signal input terminal of the sign control circuit 14, i.e., sign control means. An output terminal of the exclusive OR circuit 10 is connected to one end of the delay line 12 and one input terminal of the AND circuit 13. The other end of the delay line 12 is connected to the other input terminal of the AND circuit 13. An output terminal of the AND circuit 13 is connected to an input terminal of the sign control circuit 14. Two input terminals of the adder 15 are connected to the other end of the delay line 11 and an output terminal of the sign control circuit 14. The delay line 11 has its one end connected to a junction F and serves as signal delaying means. The adder 15 functions as signal synthesizing means.

Now, operations of the apparatus for processing frequency modulated signals will be described in relation to FIGS. 8A to 8D and 9A to 9G. FIGS. 8A to 8D show spectra of the input signal to and the output signal from the cosine equalizer 20 of the processing apparatus of FIG. 7, and characteristics of the cosine equalizer 20. FIGS. 9A to 9G are waveform diagrams of the output signals from the respective components of the processing apparatus of FIG.

7. First, the input signal is received at the one end of the delay line 1 which is connected to a junction A. The signal is outputted at a junction B, to which the other end of the delay line 1 is led, so as to be routed to the one end of the delay line 2 and the subtracters 6 and 7. The other end of the delay line 2 is connected to a junction C. Signals at the junctions A, B and C are given as Eq. 2 as in the conventional cosine equalizer. Receiving the input signal at its input terminal connected to the junction A and the output signal from the delay line 2 at its input terminal connected to the junction C, the adder 3 passes its output signal to the amplitude adjustors 4 and 5 which are connected to the junction D. The signal at the junction D is expressed by Eq. 3 as the corresponding signal in the conventional cosine equalizer. The amplitude adjustor 4 receives this signal at its input terminal which is connected to the junction D, amplifies it with a constant k1, and outputs it to the subtracter 6. Likewise, the amplitude adjustor 5 receives this signal at its input terminal which is connected to the junction D, amplifies it with a constant k2, and outputs it to the subtracter 7. The subtracter 6 receives the output signal from the delay line 1 at its input terminal connected to the junction B and the output signal from the amplitude adjustor 4 at its another input terminal which is connected to the output terminal of the amplitude adjustor 4, and subtracts the level of the latter from the level of the former. The result of the subtraction is then outputted by the subtracter 6 at its output terminal which is connected to the junction F. The signal thus available at the junction F, or one output from the cosine equalizer 20, has a waveform as that shown in FIG. 9B. On the other hand, the subtracter 7 receives the output signal from the delay line 1 at its input terminal connected to the junction B and the output signal from the amplitude adjustor 5 at its another input terminal which is connected to the output terminal of the amplitude adjustor 5, and subtracts the level of the latter from the level of the former. The subtracter 7 outputs the result of the subtraction at its output terminal which is connected to the junction G. The signal thus available at the junction G, expressed in the waveform of FIG. 9A, is the other output from the cosine equalizer 20.

Figure 8A:
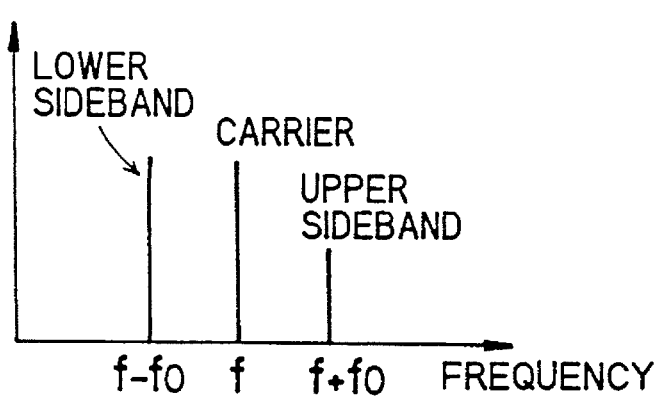
FIGS. 8A to 8D are diagrams showing characteristics of the cosine equalizer of FIG. 1.
Figure 8B:
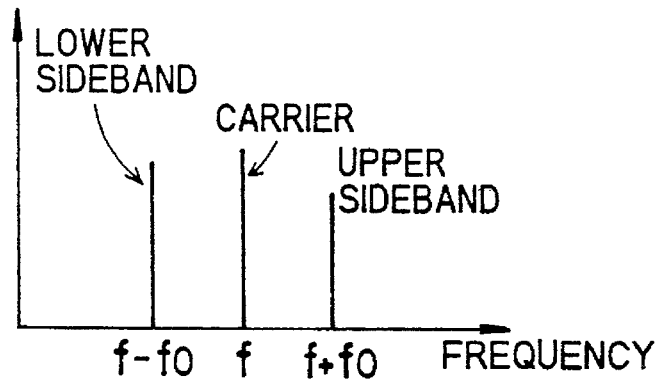
Figure 8C:
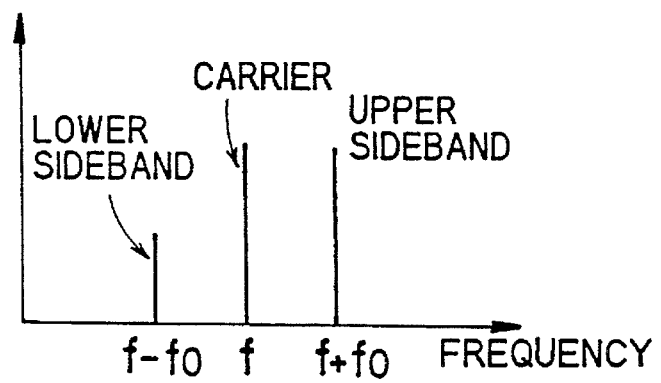
Figure 8D:
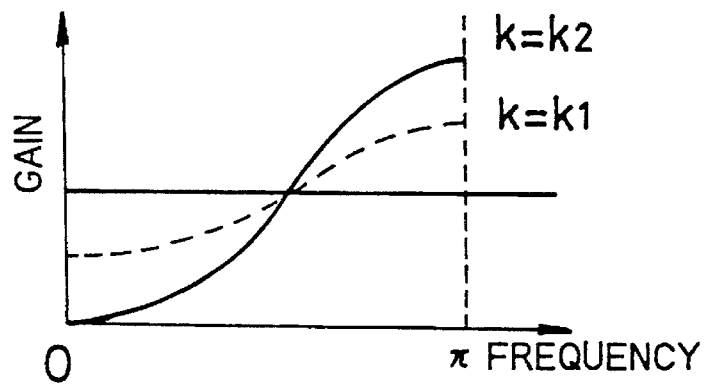

In the following, description will be given on the characteristics of the cosine equalizer 20 in light of changes in frequency components. FIG. 8A shows a frequency spectrum of a frequency modulated signal reproduced from a tape. As shown in FIG. 8A, the frequency modulated signal thus reproduced has emphasized lower sideband. Having processed with the constant k1 in the amplitude adjustor 4, the signal appears at the junction F as a signal which exhibits a spectrum as that shown in FIG. 8B in which a lower sideband intensity and an upper sideband intensity are almost equal and symmetrical. In a similar manner, after signal processing in the amplitude adjustor 5 with the constant k2, the signal appears at the junction G as a signal which has a lower sideband suppressed compared with an upper sideband as shown in FIG. 8C. Thus, the signal available at the junction G has an opposite spectrum from that of the signal of FIG. 8A. FIG. 8D shows frequency characteristics of the cosine equalizers having the constant k1 and k2, respectively. As it is understood from FIG. 8D, a lower sideband is more suppressed in the cosine equalizer with the constant k2 than in the cosine equalizer with the constant k1.

Figure 4:
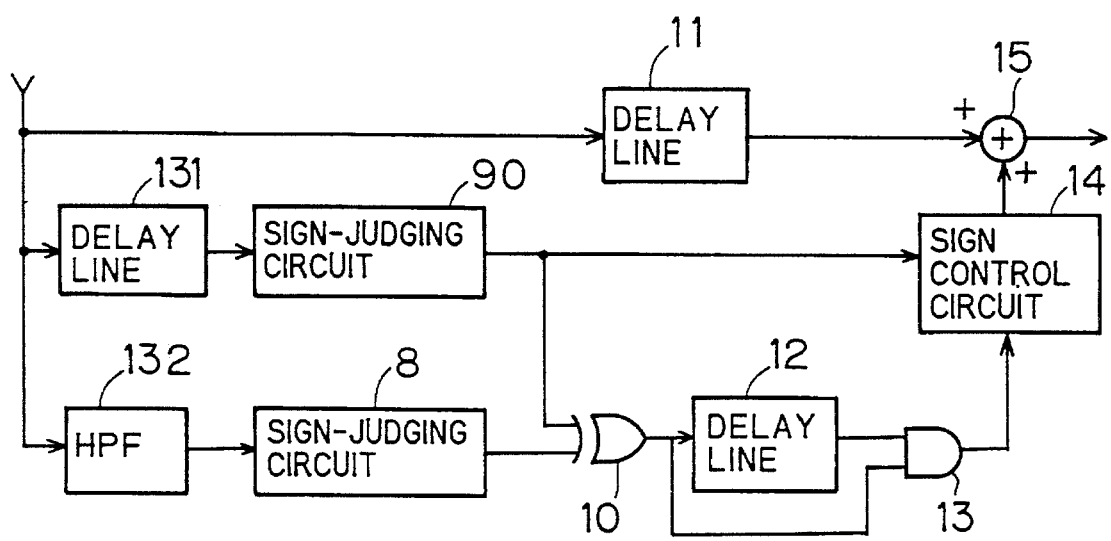
FIG. 4 is a block diagram showing structures of a conventional inversion prevention apparatus.
Figure 5A:
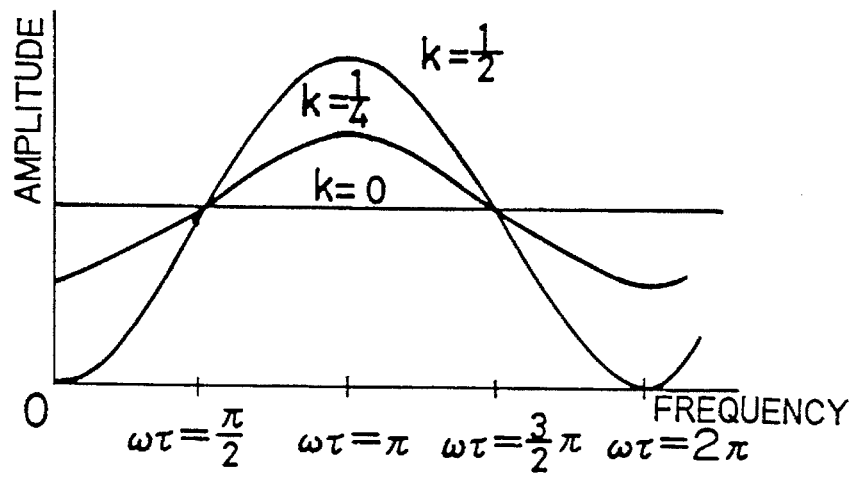
FIGS. 5A to 5C are diagrams showing characteristics of the cosine equalizer of FIG. 4.
Figure 5B:
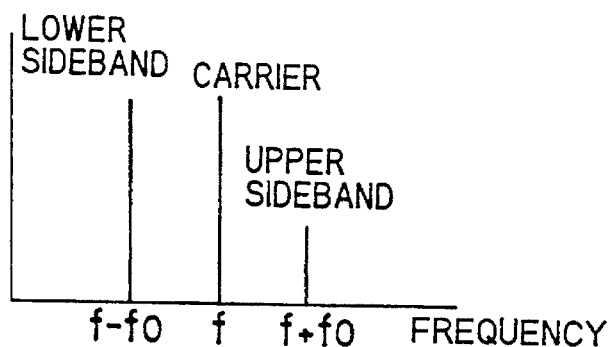
Figure 5C:
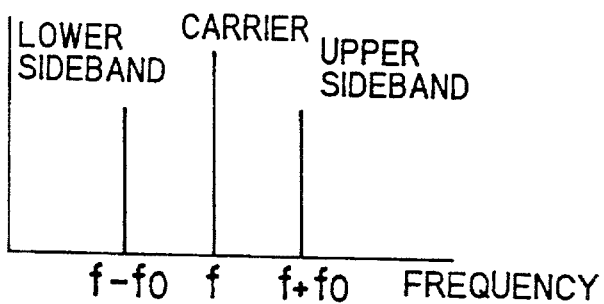

Thus, the frequency modulated signal to be given to the sign-judging circuit 9 is appropriately corrected as to its frequency characteristic to place priority on a quality of a reproduced image, and therefore includes some, if not many, zero cross points. On the other hand, the frequency modulated signal to be received by the sign-judging circuit 8 has a rather suppressed lower sideband and hence includes almost no disappearance of the zero cross points. Further, since the cosine equalizer 20 having excellent phase characteristics is used as means for suppressing a lower sideband, the pulse obtainable from the cosine equalizer 20 better reflects the disappearance of the zero cross points than the pulse obtainable from the HPF does. In addition, since the amplitude adjustors 4 and 5 use different parameters, i.e., the constants k1 and k2, the subtracters 6 and 7 generate different outputs, which eventually allows that the cosine equalizer 20 outputs a plurality of different signals. Hence, the signal representing the disappearance of the zero cross points is obtainable without the HPF of FIG. 4, simplifying the structures of the signal processing apparatus.

Next, the LIM part will be described. The conventional apparatus for processing frequency modulated signals requires that, in the LIM part thereof, the sign-judging circuit 9 receives a frequency modulated signal in which the zero cross points are disappeared and the sign-judging circuit 8 receives a frequency modulated signal which has a lower sideband suppressed by a HPF or a BPF and hence which includes almost no disappearance of the zero cross points. In the LIM part of the improved apparatus for processing frequency modulated signals shown in FIG. 7, the sign-judging circuit 9 receives a frequency modulated signal in which the zero cross points are eliminated in light of an expected picture quality, and the sign-judging circuit 8 receives a frequency modulated signal which has a lower sideband suppressed by the cosine equalizer 20 and therefore which includes almost no disappearance of the zero cross points. A waveform as shown in FIG. 9C is obtainable from the sign-judging circuit 9 while a waveform as shown in FIG. 9D is obtainable from the sign-judging circuit 8. The LIM part processes the signals in an otherwise similar manner to that performed in the conventional frequency modulated signal processing apparatus.

Although the input signals to the sign-judging circuit 8 and 9 are processed therein with different parameters, i.e., the constants k1 and k2, propagation of these signals are delayed by the same amount of time since they are equally processed through the cosine equalizer 20. This eliminates the necessity of providing the delay line 31 which is required in the conventional apparatus.

Figure 1:
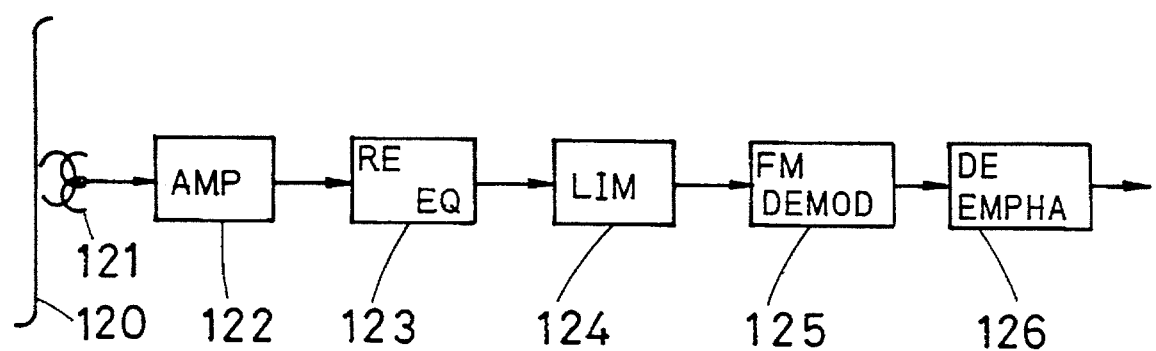
FIG. 1 is a block diagram showing structures of a reproduction system of an apparatus for processing frequency modulated signals.
Figure 2A:
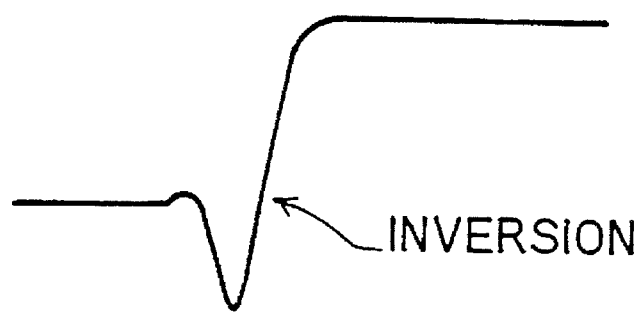
FIGS. 2A to 2D are waveform diagrams for explaining inversion.
Figure 2B:
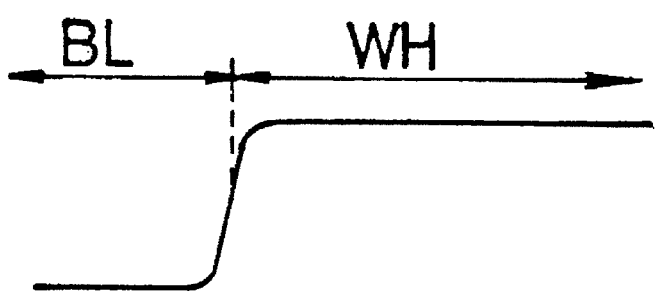
Figure 2C:
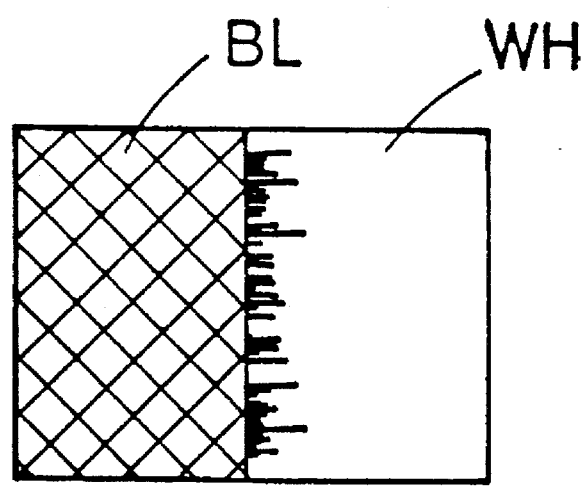
Figure 2D:
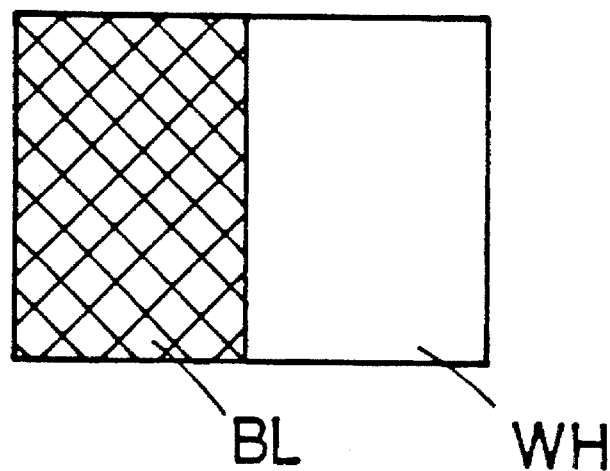
Figure 3:
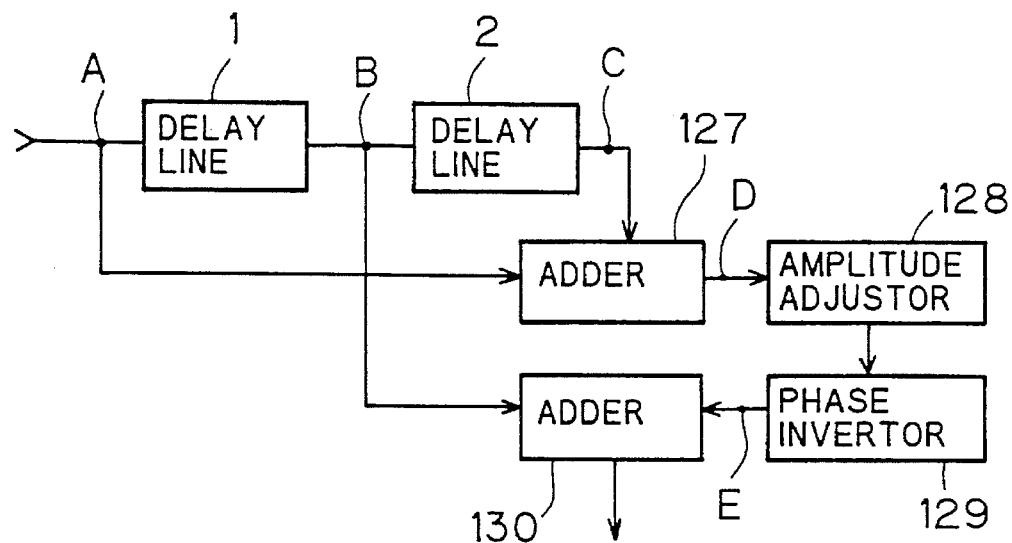
FIG. 3 is a block diagram showing structures of a conventional cosine equalizer.
Figure 10:
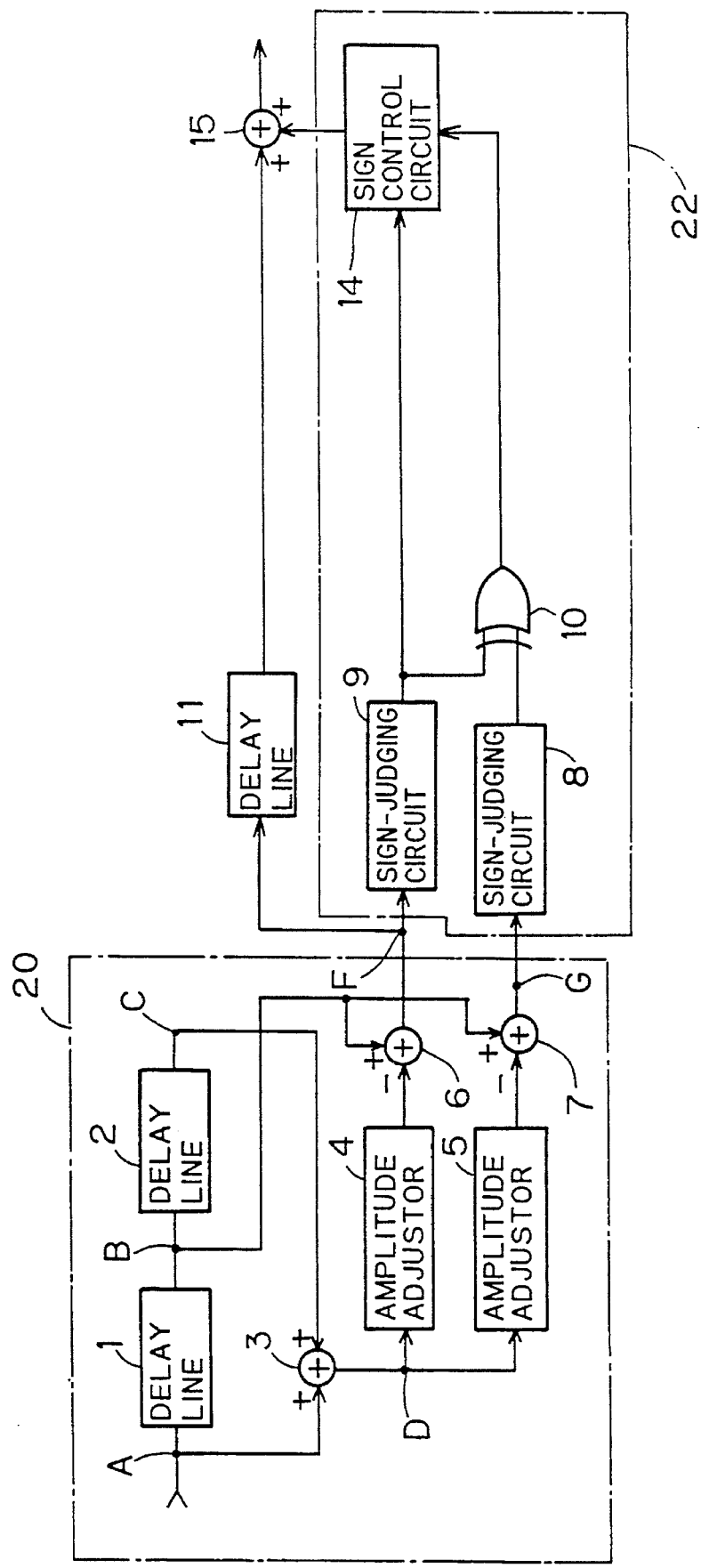
FIG. 10 is a block diagram showing structures of an apparatus for processing frequency modulated signals according to a second preferred embodiment of the present invention.

The same amount of the delay times in the input signals to the sign-judging circuit 8 and 9 also ensures that the effects of the first preferred embodiment will not be lost even in the apparatus as modified to omit the delay line 12 and the AND circuit 13 (FIG. 10, second preferred embodiment). In the apparatus of FIG. 1(), the structure of the cosine equalizer 20 remains unchanged from that of the corresponding component of the first embodiment, but its compensation signal generating means 22 is different in structure from the corresponding means of the first embodiment. Hence, signals given from the cosine equalizer 20 to the sign-judging circuits 8 and 9 remain unchanged from those transmitted in the circuit of FIG. 7, and so does signal processing in the sign-judging circuits 8 and 9. The exclusive OR circuit develops an exclusive logical sum of the output signals from the sign-judging circuits 8 and 9 of FIGS. 9C and 9D, and outputs a signal having such a waveform in which only the lost zero cross points are restored. This signal is then given to the sign control circuit 14 where it is processed as to its polarity so that the signal of FIG. 9F is derived from the sign control circuit 14. The signal of FIG. 9F is superimposed on the other output signal of the cosine equalizer 20, thereby yielding a signal as that shown in FIG. 9G in which the zero cross points are not disappeared.

Figure 11:
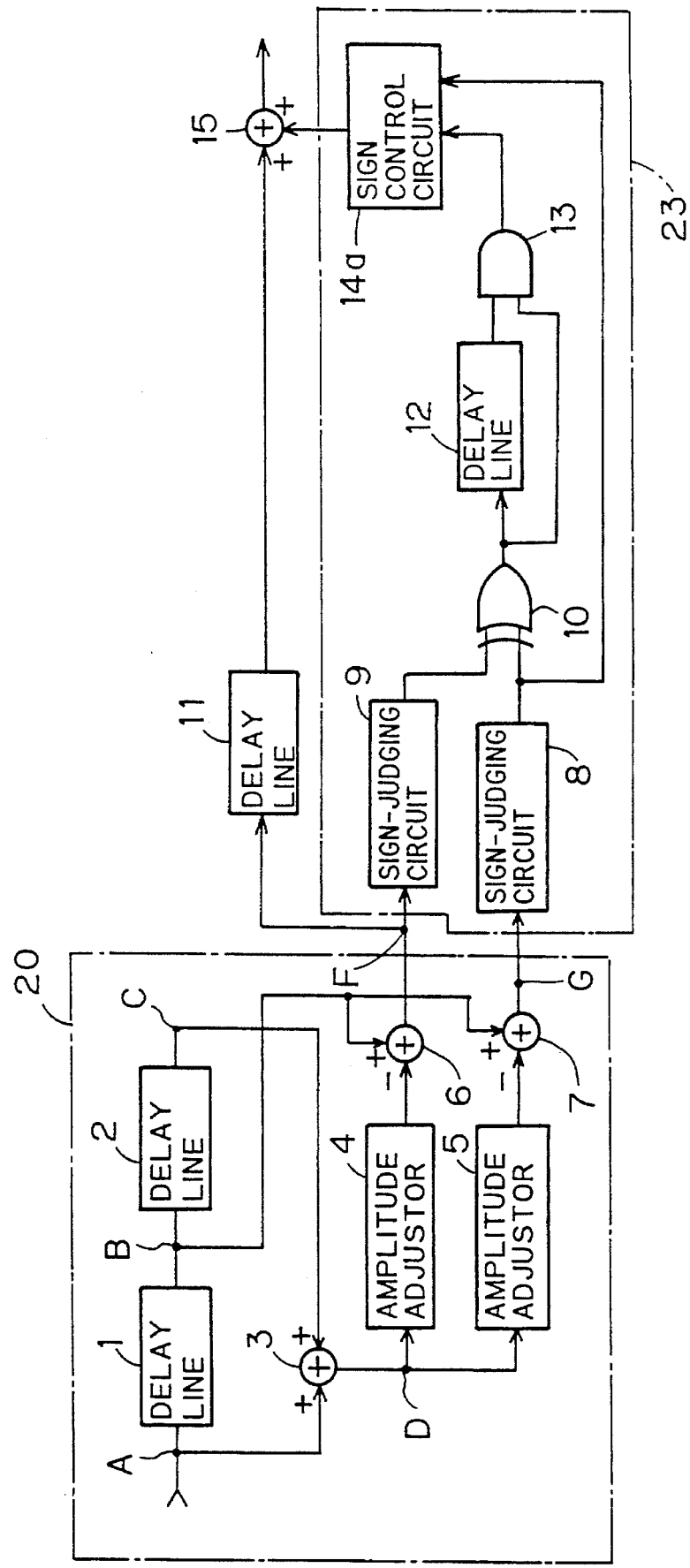
FIG. 11 is a block diagram showing another structures of the apparatus for processing frequency modulated signals of the first preferred embodiment of the present invention.
Figure 12:
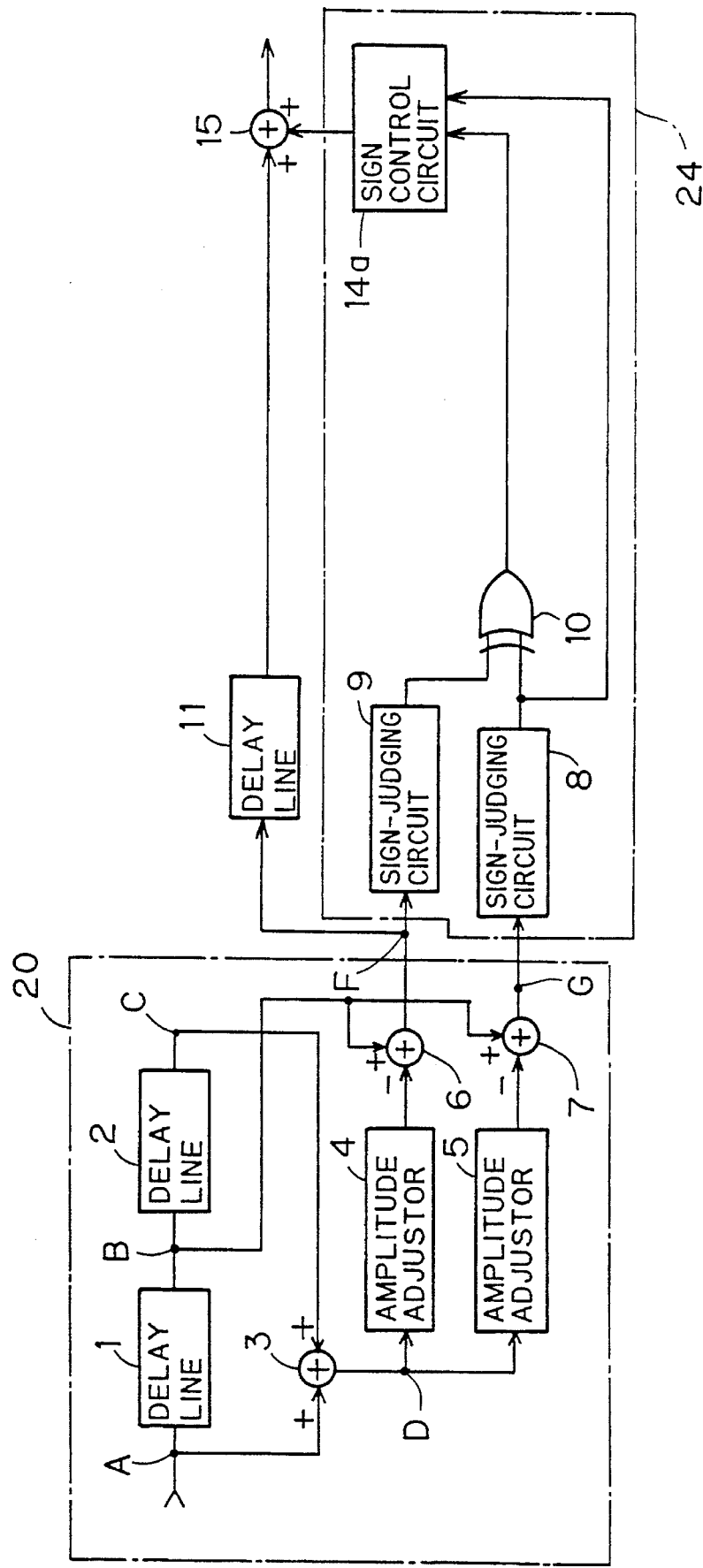
FIG. 12 is a block diagram showing another structures of the apparatus for processing frequency modulated signals of the second preferred embodiment of the present invention.

As heretofore described, in the apparatus shown in FIGS. 7, the sign control circuit 14 is responsible for sign control of the signal which represents the zero cross points and the sign control is performed in accordance with the output signal from the sign-judging circuit 9. However, the sign control may be executed in accordance with the output signal from the sign-judging circuit 8 as that shown in FIG. 11 or FIG. 12, in which case, too, the effects of the first preferred embodiment will not be degraded.

A third preferred embodiment of the present invention will be described with FIG. 13. Although the first preferred embodiment demands that the delay lines 1 and 2 are used in the cosine equalizer 20, these delay lines may be simply replaced by a reflection type delay line.

Figure 13:
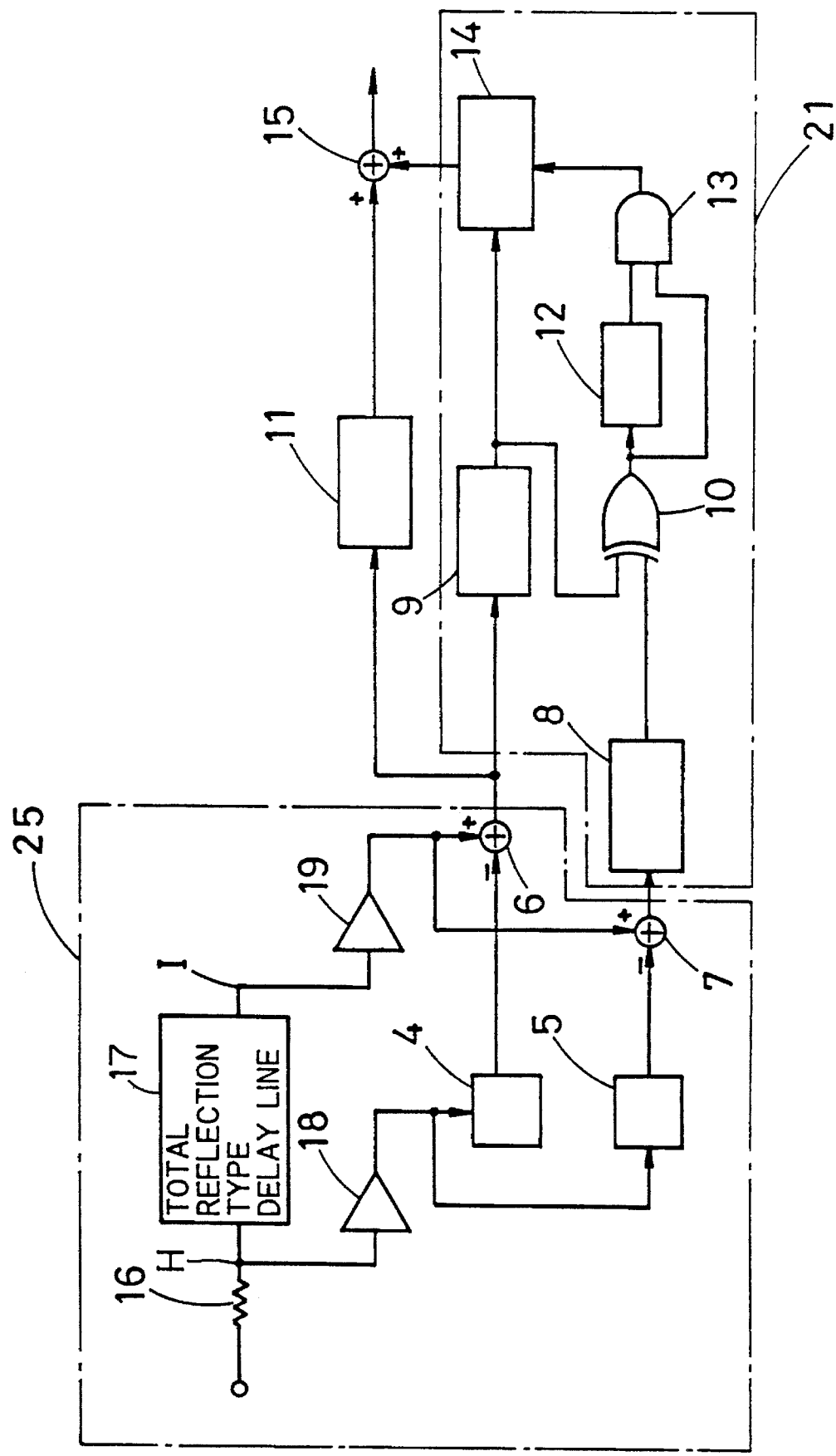
FIG. 13 is a block diagram showing structures of an apparatus for processing frequency modulated signals according to a third preferred embodiment of the present invention.

In FIG. 13, a total reflection type delay line is indicated at 17 and a matching resistor is indicated at 16. One end of the matching resistor 16 is connected to an input terminal while the other end is connected to one terminal of the total reflection type delay line 17. The matching resistor 16 adjusts the impedance of a circuit connected to the input terminal to the impedance of the total reflection type delay line 17. High input impedance buffers are indicated at 18 and 19, amplitude adjustors each comprised of a variable gain amplifier are indicated at 4 and 5, and a cosine equalizer is indicated at 25 which is formed by the resistor 16, the total reflection type delay line 17, and the high input impedance buffers 18 and 19. Components which are similar or correspond to those previously described with reference to FIG. 7 are denoted by the same reference numerals.

The total reflection type delay line 17 is a block filter comprised of a capacitor, a coil and the like. At a junction H, a signal received at the one terminal of the total reflection type delay line 17 has a proper impedance due to the matching resistor 16. Hence, no reflection of the signal occurs. However, this is not true for a junction I for which no matching resistor is provided and which is connected to another terminal of the high input impedance buffer 19 which has a high input impedance. Since the junction I is thus "open," a signal advancing in the total reflection type delay line 17 is reversed without no phase deformation at the other terminal of the total reflection type delay line 17. Hence, a signal similar to the signal obtainable at the junction D of FIG. 7 (first preferred embodiment) is obtained at the junction I and a signal similar to the output signal from the adder of FIG. 7 is obtained at the junction H, which is followed by operations similar to those in the first preferred embodiment. Thus, since the amplitude adjustors 4 and 5 use different parameters, i.e., the constants k1 and k2, the subtracters 6 and 7 develop different outputs. This eventually allows cased design complexity that a plurality of different signals are obtainable at the cosine equalizer 25 and the signal representing the disappearance of the zero cross points is generated by the delay line 17 alone, which is the same as in the first preferred embodiment. It is also to be noted that the second preferred embodiment attains enhanced design simplicity of the processing apparatus compared with that of the first preferred embodiment because only one delay line is necessary in the second preferred embodiment due which uses the total reflection type delay line 17.

Figure 14:
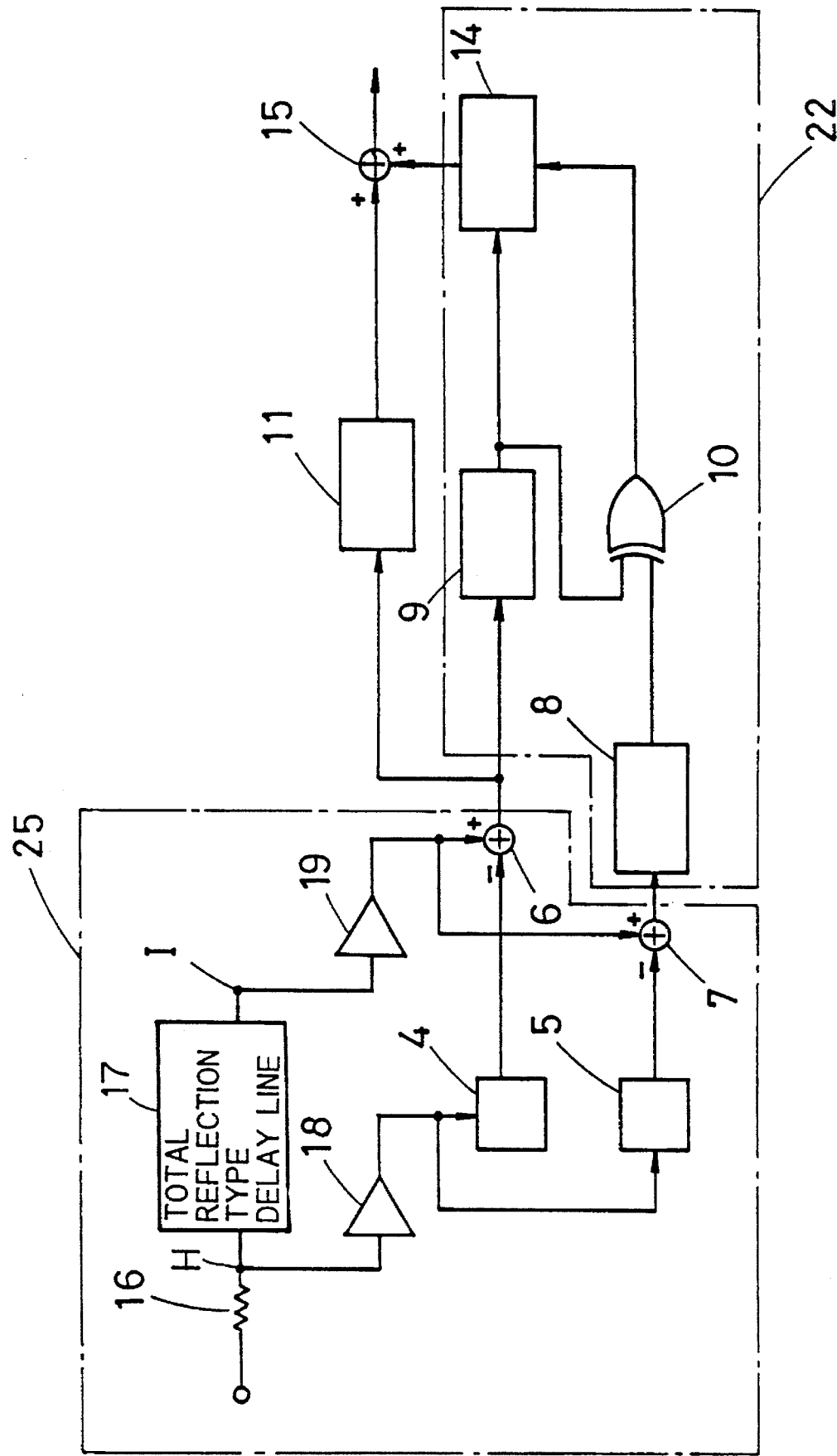
FIG. 14 is a block diagram showing another structures of the apparatus for processing frequency modulated signals of the third preferred embodiment of the present invention.

These effects are promised in the apparatus of FIG. 13 as modified to eliminate the delay line 12 and the OR circuit 13 as shown in FIG. 14, since the signals to be inputted to the sign-judging circuits 8 and 9 have the same amount of delay time.

Further, although in the apparatuses of FIGS. 13 and 14, the sign control circuit 14 performs sign control of the signal received therein which represents the zero cross points in accordance with the output signal from the sign-judging circuit 9, the signal may be sign-controlled in accordance with the output signal from the sign-judging circuit 8. The effects described above are promised in the third preferred embodiment as well.

Figure 15:
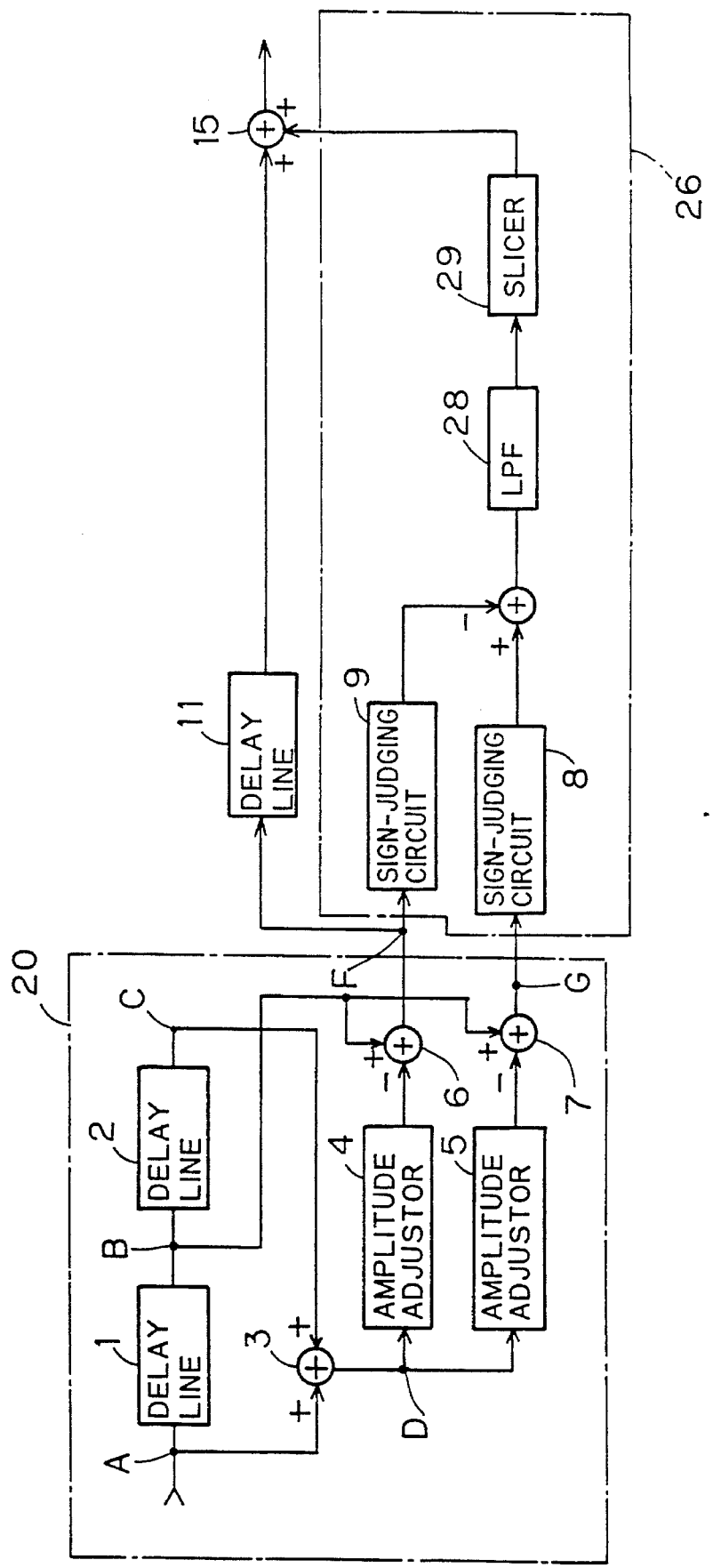
FIG. 15 is a block diagram showing another structures of the apparatus for processing frequency modulated signals of the fourth preferred embodiment of the present invention.

Next, a fourth preferred embodiment of the present invention will be described in relation to FIG. 15. FIG. 15 is a block diagram of an apparatus for processing frequency modulated signals according to the fourth preferred embodiment of the present invention. In FIG. 15, indicated at numerical reference 27 is a subtracter, indicated at 28 is a low pass filter, and indicated at 29 is a slicer. Components which are similar or correspond to those previously described with reference to FIG. 7 are denoted by the same reference numerals. Compensation signal generating means 26 is formed by the sign-judging circuits 8 and 9, the subtracter 27, the low pass filter 28 and the slicer 29. The apparatus of FIG. 15 differs from the apparatus of FIG. 7 (first preferred embodiment) in that the signal comparing means for comparing the output signals of the sign-judging circuits 8 and 9 is comprised of the subtracter 27, the low pass filter 28 and the slicer 29. The subtracter 27 subtracts the output signal of the sign-judging circuit 9 from the output signal of the sign-judging circuit 8. Since the low pass filter 28 has a fixed time constant, a signal filtered by the low pass filter 28 has an amplitude which is dependent on its pulse width. Hence, by cutting wave components which are below a predetermined threshold level by the slicer 29, pulses of a resultant signal have widths which correspond to the wave components below the threshold level.

Figure 16:
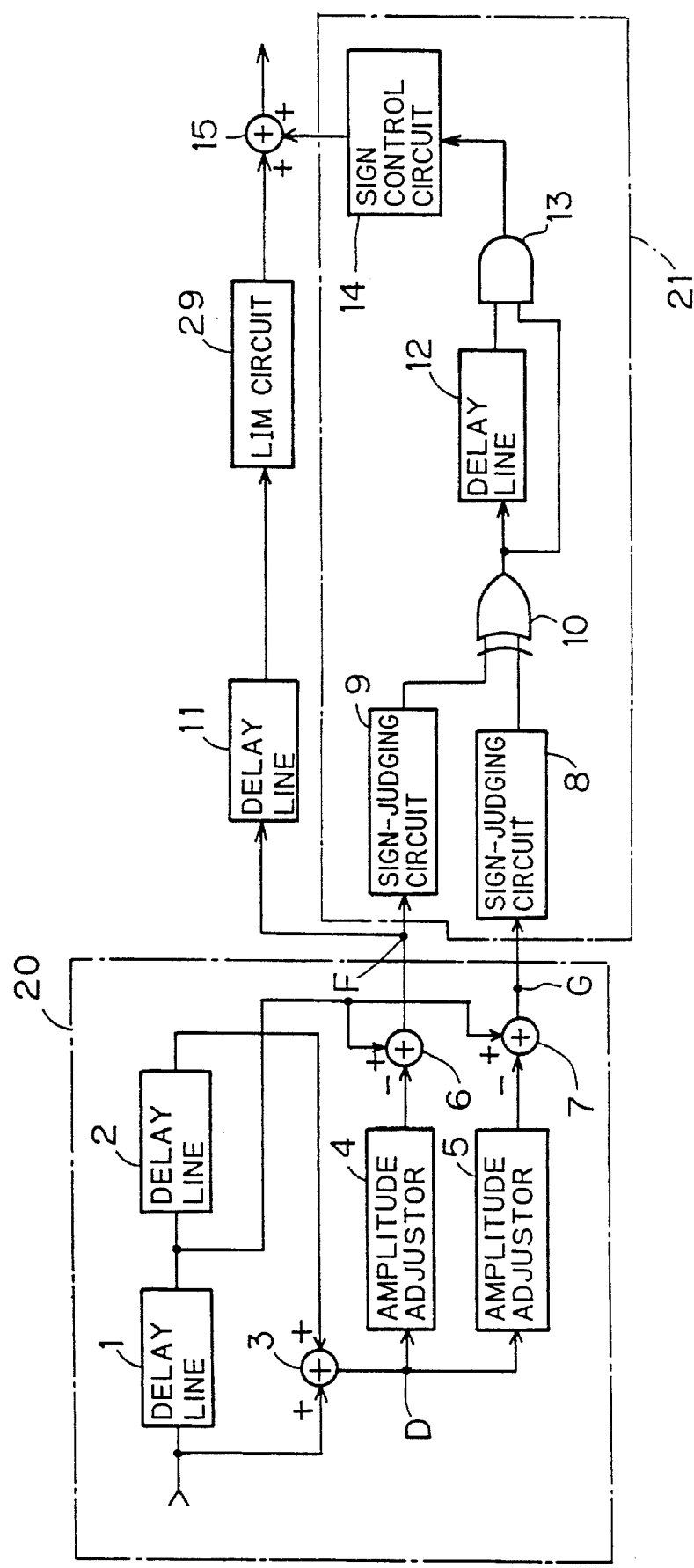
FIG. 16 is a block diagram showing another structures of the apparatus for processing frequency modulated signals of the fifth preferred embodiment of the present invention.

Next, a fifth preferred embodiment of the present invention will be described in relation to FIG. 16. FIG. 16 is a block diagram of an apparatus for processing frequency modulated signals according to the fifth preferred embodiment of the present invention. In FIG. 16, a limiting circuit is indicated at numerical reference 29. Components which are similar or correspond to those previously described with reference to FIG. 7 are denoted by the same reference numerals. The apparatus of FIG. 16 differs from the apparatus of FIG. 7 (first preferred embodiment) in requiring that the delay line 11 delays a signal from the cosine equalizer 20 to the junction F and limiting the amplitude of the delayed signal in the limiting circuit 29 before superimposing it on a compensation signal in the adder 15. By thus limiting the amplitude of the frequency modulated wave, envelope fluctuations entered in the frequency modulated wave during signal transmission are eliminated before the superimposition.

Figure 17:
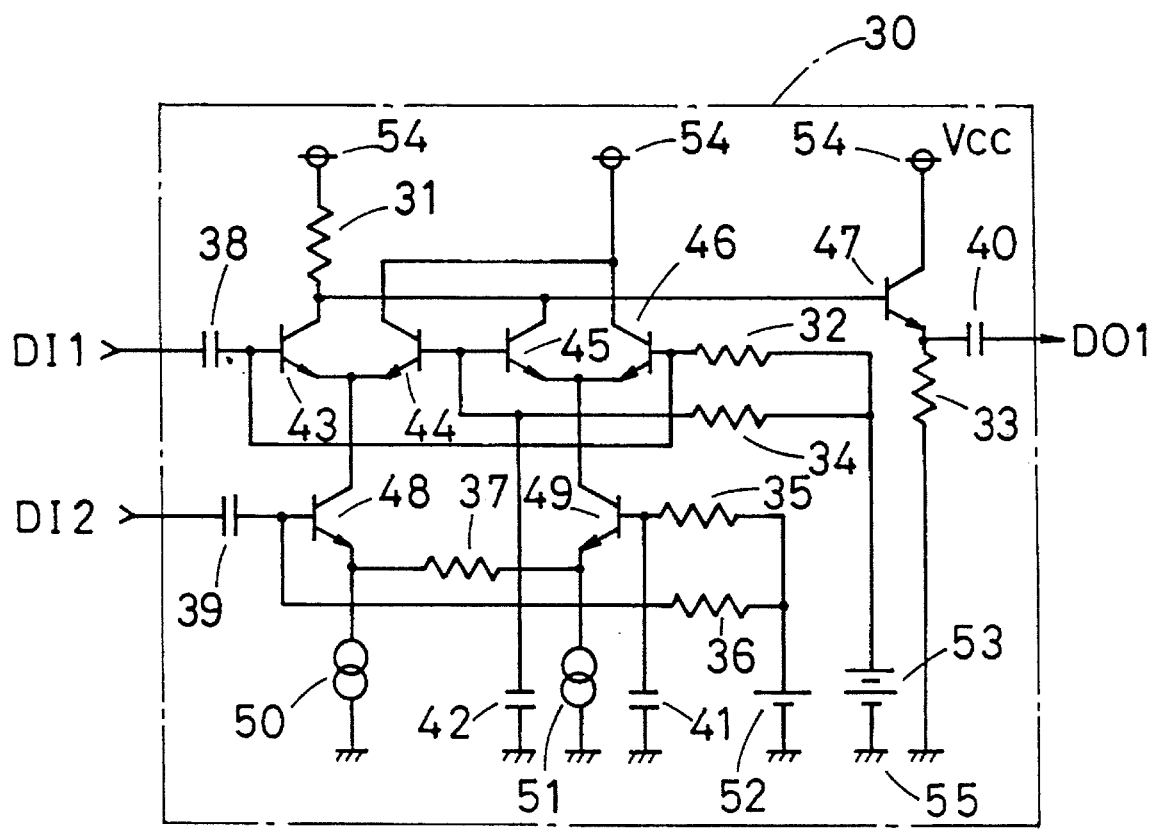
FIG. 17 is a circuitry diagram showing an example of a sign control circuit used in the present invention.

The sign control circuit 14 used in each preferred embodiment is tailored as shown in FIG. 17. In FIG. 17, a sign control 30 is depicted as an example of the sign control circuit 14. Resistors are indicated at 31 to 37, capacitors are indicated at 38 to 42, NPN transistors are indicated at 43 to 49, constant current sources are indicated at 50 and 51, constant voltage sources are indicated at 52 and 53, a power source is indicated at 54, and a ground is indicated at 55. In accordance with a signal DI2 received at its input terminal, the sign control circuit 30 reverses or does not reverse the sign of a signal DI1 to thereby output an output signal DO1.

Figure 18:
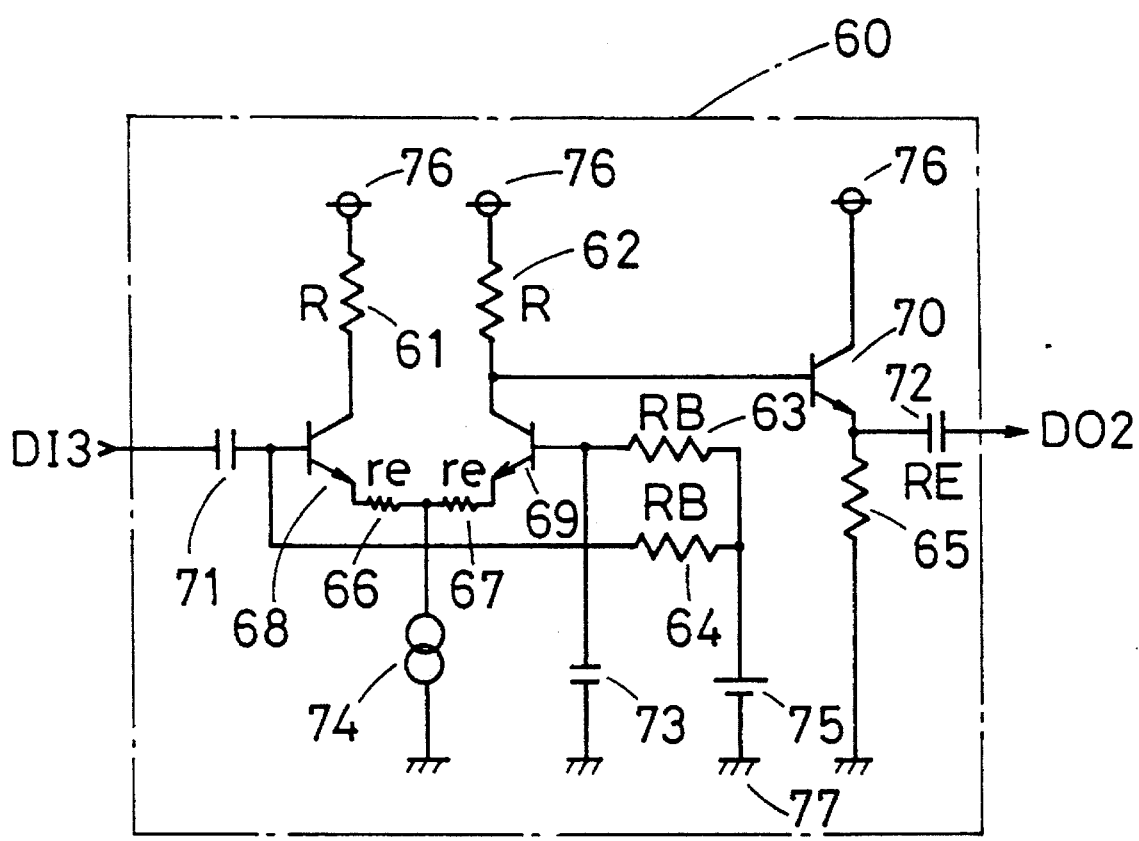
FIGS. 18 and 19 are circuitry diagrams showing examples of a sign-judging circuit used in the present invention.
Figure 19:
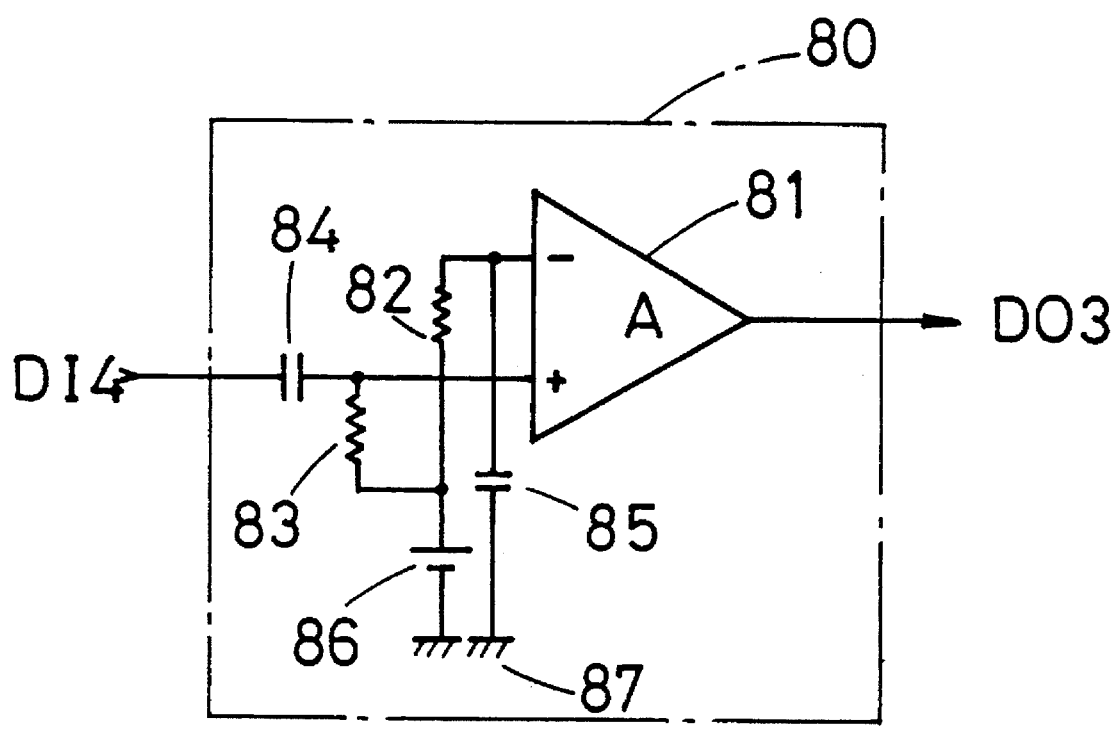

The sign-judging circuits 8 and 9 are structured as shown in FIGS. 18 and 19 in each preferred embodiment. In FIG. 18, a sign-judging circuit 60 is depicted as an example of the sign-judging circuits 8 and 9. Resistors are indicated at 61 to 67, NPN transistors are indicated at 68 to 70, capacitors are indicated at 71 to 73, a constant current source is indicated at 74, a constant voltage source is indicated at 75, a power source is indicated at 76, and a ground is indicated at 77. A relation re<<RA is satisfied between the resistance re of the resistors 66 and 67 and the resistance R of the resistors 61 and 62. The sign-judging circuit 60 judges the polarity of an input signal DI3 received at its input terminal and outputs an output signal DO2 which has a binary logical level. In FIG. 19, a sign-judging circuit 80 is depicted as another example of the sign-judging circuits 8 and 9. A differential amplifier is indicated at 81, resistors are indicated at 82 and 83, capacitors are indicated at 84 and 85, a constant voltage source is indicated at 86 and a ground is indicated at 87. The sign-judging circuit 80 judges the polarity of an input signal DI4 received at its input terminal and outputs an output signal DO3 which has a binary logical level.

Figure 20A:
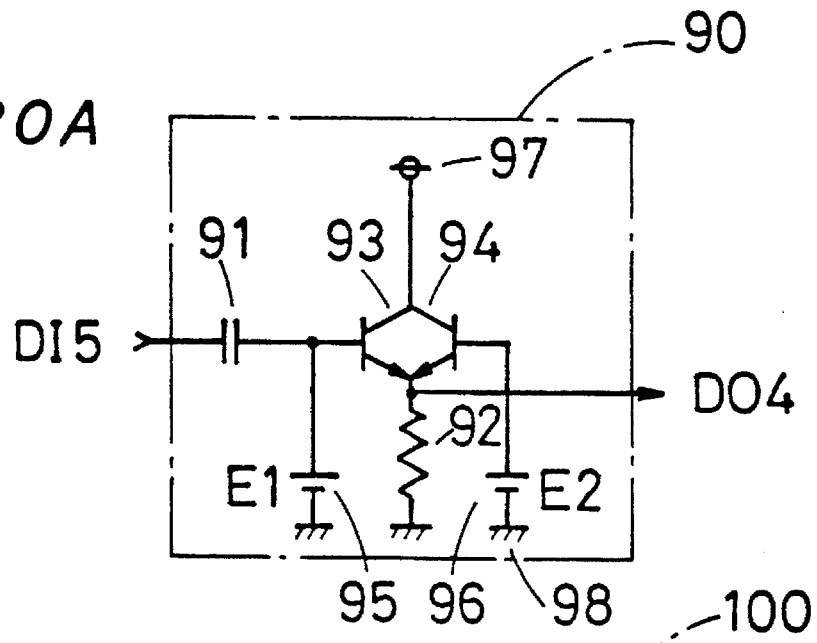
FIGS. 20A and 20B are circuitry diagrams showing examples of a slicer used in the present invention.
Figure 20B:
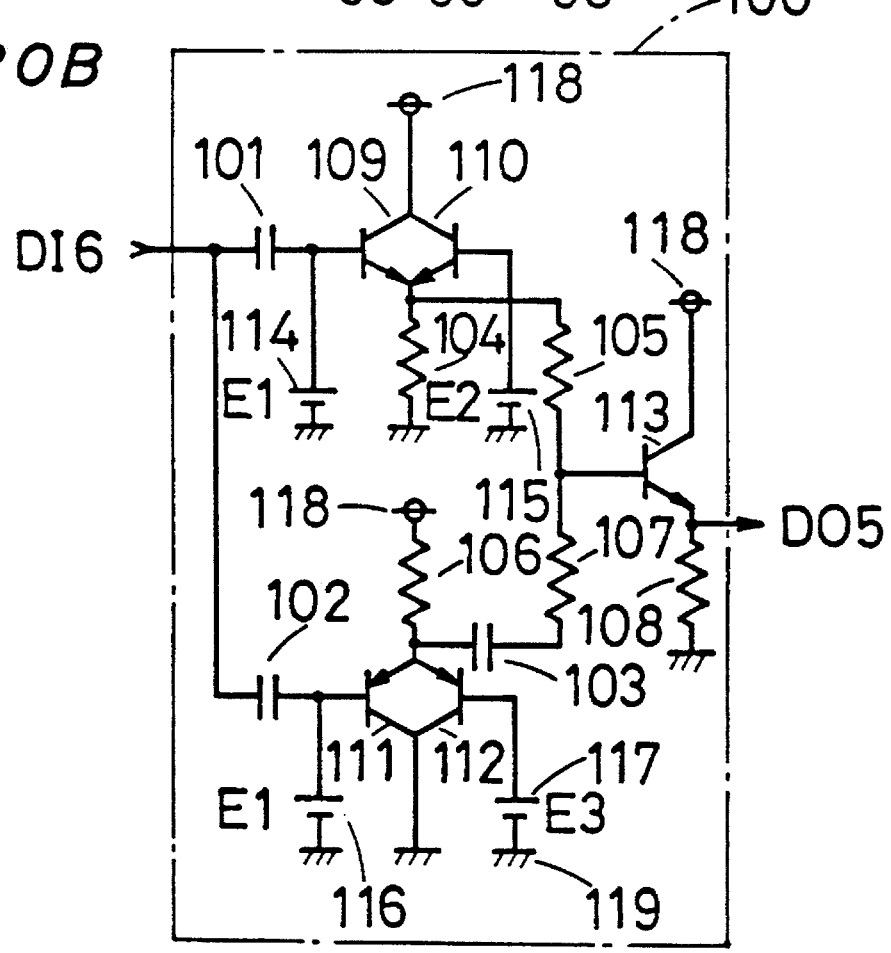

FIGS. 20A and 20B show circuit structures of the slicer 29 employed in the fifth preferred embodiment. FIG. 20A shows a one-side slicer while FIG. 20B shows a two-side slicer. In FIG. 20A, a slicer 90 is depicted as an example of the slicer 29, a capacitor is indicated at 91, a resistor is indicated at 92, NPN transistors are indicated at 93 and 94, constant voltage sources are indicated at 95 and 96, a power source is indicated at 97, and a ground is indicated at 98. The slicer 90 cuts signal components of an input signal DI5 which are below a predetermined threshold level (E2-E1), and outputs an output signal DO4. In FIG. 20B, a slicer 100 is depicted as another example of the slicer 29, capacitors are indicated at 101 to 103, resistors are indicated at 104 to 108, an NPN transistors are indicated at 109 and 110, PNP transistors are indicated at 111 and 112, constant voltage sources are indicated at 114 to 117, a power source is indicated at 118, and a ground is indicated at 119. The slicer 100 cuts signal components of an input signal DI6 which are below a predetermined threshold level (E3-E1), and outputs an output signal DO5.

While the invention has been described in detail in relation to only a few embodiments, the foregoing description is in all aspects illustrative and not restrictive. It is understood that numerous other modifications and variations can be devised without departing from the scope of the invention.

I claim:

1. An apparatus for processing frequency modulated signals, comprising:

a cosine equalizer including an input terminal for receiving an input signal, a first output terminal and a second output terminal, said cosine equalizer processing said input signal with a first and a second parameters which are different from each other to thereby generate a first and a second signals, said first and said second signals being outputted at said first and said second output terminals, respectively;

compensation signal generating means connected to said first and said second output terminals of said cosine equalizer, said compensation signal generating means processing said first and said second signals, detecting zero cross points which are lost from said first signal, and generating a compensation signal which is used to compensate for said zero cross points;

signal delaying means having an input terminal which is connected to said first output terminal of said cosine equalizer, said signal delaying means delaying said first signal for a time required for generating said compensation signal; and signal synthesizing means having one input terminal and the other input terminal, said one input terminal being connected to an output terminal of said compensation signal generating means, said other input terminal being connected to an output terminal of said signal delaying means, said signal synthesizing means superimposing said output signal from said compensation signal generating means on an output signal from said signal delaying means.

2. The apparatus for processing frequency modulated signals of claim 1, wherein said signal synthesizing means includes an adder.

3. The apparatus for processing frequency modulated signals of claim 1, wherein said cosine equalizer includes:

first delaying means having an input terminal connected to said input terminal of said cosine equalizer;

second delaying means having an input terminal connected to an output terminal of said first delaying means;

an adder connected to said input terminal of said cosine equalizer and an output terminal of said second delaying means, said adder superimposing said input signal on an output signal from said second delaying means;

a first amplitude adjustor having an input terminal connected to an output terminal of said adder, said first amplitude adjustor amplifying an output signal from said adder by a first constant;

a second amplitude adjustor having an input terminal connected to said output terminal of said adder, said first amplitude adjustor amplifying said output signal from said adder by a second constant;

a first subtracter, one input terminal of said first subtracter being connected to said output terminal of said first delaying means, the other input terminal of said first subtracter being connected to an output terminal of said first amplitude adjustor, said first subtracter subtracting an output signal of said first amplitude adjustor from an output signal of said first delaying means; and a second subtracter, one input terminal of said second subtracter being connected to said output terminal of said first delaying means, the other input terminal of said second subtracter being connected to said output terminal of an second amplitude adjustor, said second subtracter subtracting an output signal of said second amplitude adjustor from said output signal of said first delaying means.

4. The apparatus for processing frequency modulated signals of claim 3, wherein said compensation signal generating means includes:

a first sign-judging means having an input terminal connected to said first output terminal of said cosine equalizer, said first sign-judging means receiving said first signal at said input terminal thereof, judging whether said first signal is positive or negative, and outputting a signal indicative of a judgment;

a second sign-judging means having an input terminal connected to said second output terminal of said cosine equalizer, said second sign-judging means receiving said second signal at said input terminal thereof, judging whether said second signal is positive or negative, and outputting an output signal indicative of the judgment;

signal comparing means, one input terminal of said one input terminal of said signal comparing means being connected to an output terminal of said first sign-judging means, the other input terminal of said signal comparing means being connected to an output terminal of said second sign-judging means, said signal comparing means comparing said output from said first sign-judging means with said output from said second sign-judging means, detecting a different portion between said output signals of said first and said second sign-judging means, and outputting an output signal indicative of the comparison; and sign control means, one input terminal of said one input terminal of said sign control means being connected to said output terminal of said first sign-judging means, the other input terminal of said sign control means being connected to an output terminal of said signal comparing means, said sign control means outputting a negative going signal in accordance with said output signal from said signal comparing means if said different portion in said output signal of said first sign-judging means has is positive, said sign control means outputting a positive going signal in accordance with said output signal from said signal comparing means if said different portion in said output signal of said first sign-judging means has is negative.

5. The apparatus for processing frequency modulated signals of claim 4, wherein an output terminal of said signal comparing means is directly connected to said other input terminal of said sign control means.

6. The apparatus for processing frequency modulated signals of claim 4, wherein said signal comparing means includes an exclusive OR circuit, input terminals of said exclusive OR circuit being respectively connected to said output terminals of said first and said second sign-judging means.

7. The apparatus for processing frequency modulated signals of claim 4, wherein said compensation signal generating means further includes:

another signal delaying means having an input terminal connected to said output terminal of said signal comparing means; and an AND gate, one input terminal of said AND gate being connected to said output terminal of said signal comparing means, the other input terminal of said AND gate being connected to an output terminal of said another signal comparing means, an output terminal of said AND gate being connected to said input terminal of said sign control means.

8. The apparatus for processing frequency modulated signals of claim 3, wherein said compensation signal generating means includes:

a first sign-judging means having an input terminal connected to said first output terminal of said cosine equalizer, said first sign-judging means receiving said first signal at said input terminal thereof, judging whether said first signal is positive or negative, and outputting a signal indicative of a judgment;

a second sign-judging means having an input terminal connected to said second output terminal of said cosine equalizer, said second sign-judging means receiving said second signal at said input terminal thereof, judging whether said second signal is positive or negative, and outputting an output signal indicative of the judgment;

signal comparing means, one input terminal of said one input terminal of said signal comparing means being connected to an output terminal of said first sign-judging means, the other input terminal of said signal comparing means being connected to an output terminal of said second sign-judging means, said signal comparing means comparing said output from said first sign-judging means with said output from said second sign-judging means, detecting a different portion between said output signals of said first and said second sign-judging means, and outputting an output signal indicative of the comparison; and sign control means, one input terminal of said one input terminal of said sign control means being connected to said output terminal of said second sign-judging means, the other input terminal of said sign control means being connected to an output terminal of said signal comparing means, said sign control means outputting a negative going signal in accordance with said output signal from said signal comparing means if said different portion in said output signal of said second sign-judging means has is positive, said sign control means outputting a positive going signal in accordance with said output signal from said signal comparing means if said different portion in said output signal of said second sign-judging means has is negative.

9. The apparatus for processing frequency modulated signals of claim 8, wherein said signal comparing means includes an exclusive OR circuit, input terminals of said exclusive OR circuit being respectively connected to said output terminals of said first and said second sign-judging means.

10. The apparatus for processing frequency modulated signals of claim 8, wherein said compensation signal generating means further includes:

another signal delaying means having an input terminal connected to said output terminal of said signal comparing means; and an AND gate, one input terminal of said AND gate being connected to said output terminal of said signal comparing means, the other input terminal of said AND gate being connected to an output terminal of said another signal comparing means, an output terminal of said AND gate being connected to said input terminal of said sign control means.

11. The apparatus for processing frequency modulated signals of claim 3, wherein said second constant is greater than said first constant.

12. The apparatus for processing frequency modulated signals of claim 3, wherein said first and said second delaying means include a delay line.

13. The apparatus for processing frequency modulated signals of claim 1, wherein said cosine equalizer includes:

impedance adjusting means having one terminal connected to said input terminal of said cosine equalizer;

a total reflection type delaying means having one terminal connected to said the other terminal of said impedance adjusting means;

a first buffer having an input terminal connected to said other terminal of said impedance adjusting means, said first buffer having a high input impedance;

a second buffer having an input terminal connected to said other input terminal of said total reflection type delaying means, said second buffer having a high input impedance;

a first amplitude adjustor having an input terminal connected to an output terminal of said first buffer, said first amplitude adjustor amplifying an output signal from said first buffer by a first constant;

a second amplitude adjustor having an input terminal connected to said output tern-final of said first buffer, said second amplitude adjustor amplifying said output signal from said first buffer by a second constant;

a first subtracter, one input terminal of said first subtracter being connected to an output terminal of said second buffer, the other input terminal of said first subtracter being connected to an output terminal of said first amplitude adjustor, said first subtracter subtracting an output signal of said first amplitude adjustor from an output signal of said second buffer; and a second subtracter, one input terminal of said second subtracter being connected to said output terminal of said second buffer, the other input terminal of said second subtracter being connected to said output terminal of an second amplitude adjustor, said second subtracter subtracting an output signal of said second amplitude adjustor from said output signal of said second buffer.

14. The apparatus for processing frequency modulated signals of claim 13, wherein said impedance adjusting means is comprised of resistors.

15. The apparatus for processing frequency modulated signals of claim 13, wherein said compensation signal generating means includes:

a first sign-judging means having an input terminal connected to said first output terminal of said cosine equalizer, said first sign-judging means receiving said first signal at said input terminal thereof, judging whether said first signal is positive or negative, and outputting a signal indicative of a judgment;

a second sign-judging means having an input terminal connected to said second output terminal of said cosine equalizer, said second sign-judging means receiving said second signal at said input terminal thereof, judging whether said second signal is positive or negative, and outputting an output signal indicative of the judgment;

signal comparing means, one input terminal of said one input terminal of said signal comparing means being connected to an output terminal of said first sign-judging means, the other input terminal of said signal comparing means being connected to an output terminal of said second sign-judging means, said signal comparing means comparing said output from said first sign-judging means with said output from said second sign-judging means, detecting a different portion between said output signals of said first and said second sign-judging means, and outputting an output signal indicative of the comparison; and sign control means, one input terminal of said one input terminal of said sign control means being connected to said output terminal of said first sign-judging means, the other input terminal of said sign control means being connected to an output terminal of said signal imparing means, said sign control means outputting a negative going signal in accordance with said output signal from said signal comparing means if said different portion in said output signal of said first sign-judging means has is positive, said sign control means outputting a positive going signal in accordance with said output signal from said signal comparing means if said different portion in said output signal of said first sign-judging means has is negative.

16. The apparatus for processing frequency modulated signals of claim 15, wherein an output terminal of said signal comparing means is directly connected to said other input terminal of said sign control means.

17. The apparatus for processing frequency modulated signals of claim 15, wherein said signal comparing means includes an exclusive OR circuit, input terminals of said exclusive OR circuit being respectively connected to said output terminals of said first and said second sign-judging means.

18. The apparatus for processing frequency modulated signals of claim 15, wherein said compensation signal generating means further includes:

another signal means having an input terminal connected to said output terminal of said signal comparing means; and an AND gate, one input terminal of said AND gate being connected to said output terminal of said signal comparing means, the other input terminal of said AND gate being connected to an output terminal of said another signal comparing means, an output terminal of said AND gate being connected to said input terminal of said sign control means.

19. The apparatus for processing frequency modulated signals of claim 13, wherein said compensation signal generating means includes:

a first sign-judging means having an input terminal connected to said first output terminal of said cosine equalizer, said first sign-judging means receiving said first signal at said input terminal thereof, judging whether said first signal is positive or negative, and outputting a signal indicative of a judgment;

a second sign-judging means having an input terminal connected to said second output terminal of said cosine equalizer, said second sign-judging means receiving said second signal at said input terminal thereof, judging whether said second signal is positive or negative, and outputting an output signal indicative of the judgment;

signal comparing means, one input terminal of said one input terminal of said signal comparing means being connected to an output terminal of said first sign-judging means, the other input terminal of said signal comparing means being connected to an output terminal of said second sign-judging means, said signal comparing means comparing said output from said first sign-judging means with said output from said second sign-judging means, detecting a different portion between said output signals of said first and said second sign-judging means, and outputting an output signal indicative of the comparison; and sign control means, one input terminal of said one input terminal of said sign control means being connected to said output terminal of said second sign-judging means, the other input terminal of said sign control means being connected to an output terminal of said signal comparing means, said sign control means outputting a positive going signal in accordance with said output signal from said signal comparing means if said different portion in said output signal of said second sign-judging means has is negative said sign control means outputting a positive going signal in accordance with said output signal from said signal comparing means if said different portion in said output signal of said second sign-judging means has is negative.

20. The apparatus for processing frequency modulated signals of claim 19, wherein said signal comparing means includes an exclusive OR circuit, input terminals of said exclusive OR circuit being respectively connected to said output terminals of said first and said second sign-judging means.

21. The apparatus for processing frequency modulated signals of claim 19, wherein said compensation signal generating means further includes:

another signal delaying means having an input terminal connected to said output terminal of said signal comparing means; and an AND gate, one input terminal of said AND gate being connected to said output terminal of said signal comparing means, the other input terminal of said AND gate being connected to an output terminal of said another signal comparing means, an output terminal of said AND gate being connected to said input terminal of said sign control means.

22. The apparatus for processing frequency modulated signals of claim 13, wherein said second constant is greater than said first constant.

23. The apparatus for processing frequency modulated signals of claim 13, wherein said total reflection type delaying means includes a total reflection type delay line.

24. The apparatus for processing frequency modulated signals of claim 13, wherein said another delaying means includes a delay line.

* * * * *